(12) United States Patent
Laven et al.

(10) Patent No.: US 11,538,906 B2
(45) Date of Patent: Dec. 27, 2022

(54) DIODE WITH STRUCTURED BARRIER REGION

(71) Applicant: Infineon Technologies AG, Neubiberg (DE)

(72) Inventors: Johannes Georg Laven, Taufkirchen (DE); Roman Baburske, Otterfing (DE); Alexander Philippou, Munich (DE); Christian Philipp Sandow, Haar (DE)

(73) Assignee: Infineon Technologies AG, Neubiberg (DE)

( * ) Notice: Subject to any disclaimer, the term of this patent is extended or adjusted under 35 U.S.C. 154(b) by 273 days.

(21) Appl. No.: 17/016,472

(22) Filed: Sep. 10, 2020

(65) Prior Publication Data

US 2021/0083051 A1    Mar. 18, 2021

(30) Foreign Application Priority Data

Sep. 17, 2019    (DE) .......................... 102019125010.2

(51) Int. Cl.
| | |
|---|---|
| *H01L 29/06* | (2006.01) |
| *H01L 29/861* | (2006.01) |
| *H01L 29/66* | (2006.01) |
| *H01L 29/739* | (2006.01) |

(52) U.S. Cl.
CPC .... *H01L 29/0696* (2013.01); *H01L 29/66136* (2013.01); *H01L 29/66348* (2013.01); *H01L 29/7397* (2013.01); *H01L 29/861* (2013.01)

(58) Field of Classification Search
CPC ........... H01L 29/0696; H01L 29/66136; H01L 29/66348; H01L 29/7397; H01L 29/861; H01L 29/407; H01L 29/8613; H01L 29/417; H01L 27/0664; H01L 29/6609; H01L 29/66325–66348; H01L 29/7393–7398; H01L 29/083–0834;
(Continued)

(56) References Cited

U.S. PATENT DOCUMENTS

| | | | |
|---|---|---|---|
| 2005/0073030 A1 | 4/2005 | Inoue et al. | |
| 2016/0351562 A1* | 12/2016 | Senoo | ................. H01L 27/0727 |
| 2019/0115460 A1* | 4/2019 | Hirabayashi | ........ H01L 29/0834 |

(Continued)

FOREIGN PATENT DOCUMENTS

JP    2009267116 A    11/2009

*Primary Examiner* — Shahed Ahmed
(74) *Attorney, Agent, or Firm* — Murphy, Bilak & Homiller, PLLC

(57) ABSTRACT

A power device includes: a diode section; a semiconductor body; a drift region extending into the diode section; trenches in the diode section and extending along a vertical direction into the semiconductor body, two adjacent trenches defining a respective mesa portion in the semiconductor body; a body region in the mesa portions; in the diode section, a barrier region between the body and drift regions and having a dopant concentration at least 100 times greater than an average dopant concentration of the drift region and a dopant dose greater than that of the body region. The barrier region has a lateral structure according to which at least 50% of the body region in the diode section is coupled to the drift region at least by the barrier region, and at least 5% of the body region in the diode section is coupled to the drift region without the barrier region.

18 Claims, 20 Drawing Sheets

(58) Field of Classification Search
CPC ..... H01L 27/0259–0262; H01L 27/0711–0722
See application file for complete search history.

(56) References Cited

U.S. PATENT DOCUMENTS

| | | | |
|---|---|---|---|
| 2019/0287961 A1* | 9/2019 | Naito | H01L 29/1079 |
| 2019/0287963 A1* | 9/2019 | Kondoh | H01L 27/0629 |
| 2020/0258991 A1* | 8/2020 | Hoshi | H01L 29/1608 |

* cited by examiner

FIG 5 (CONTINUED)
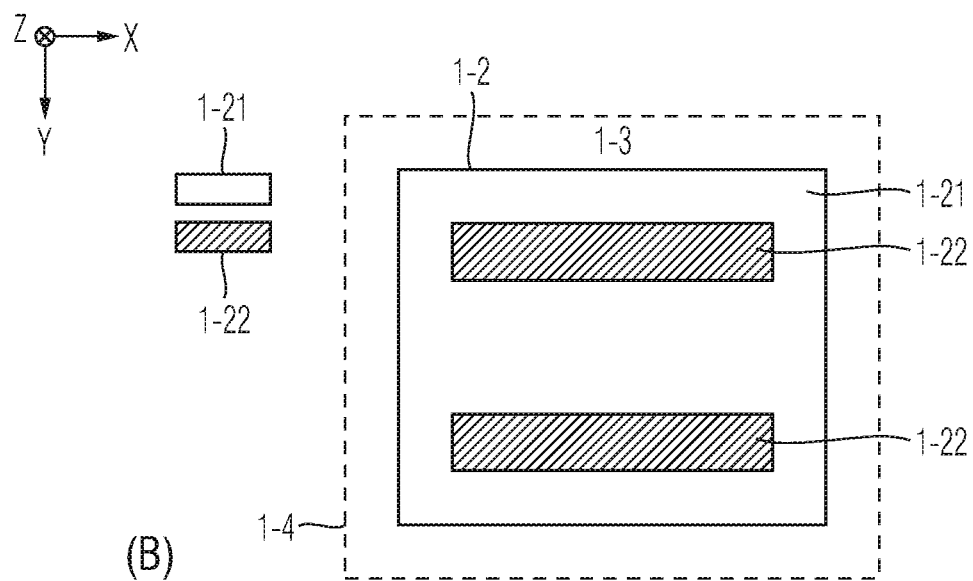
(B)
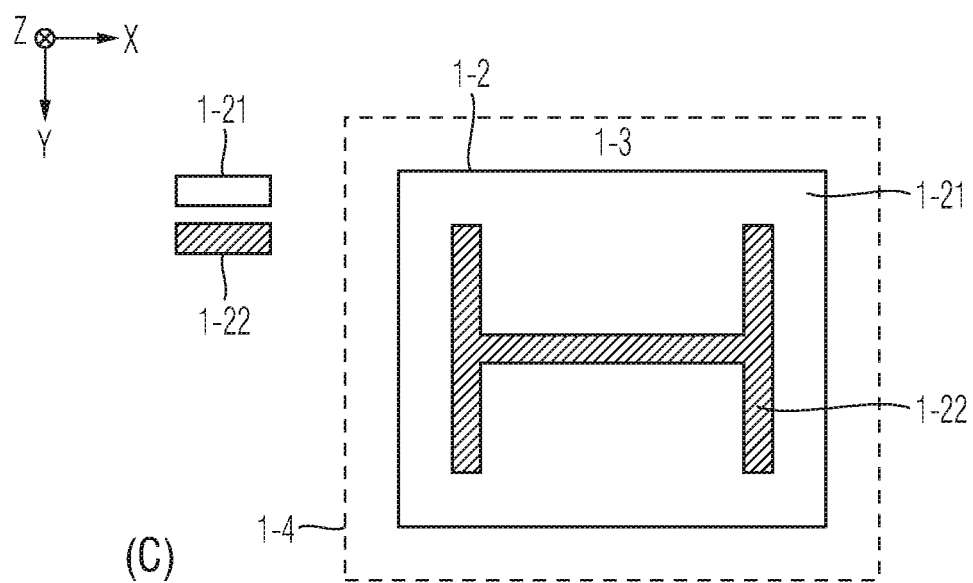
(C)

FIG 5 (CONTINUED)
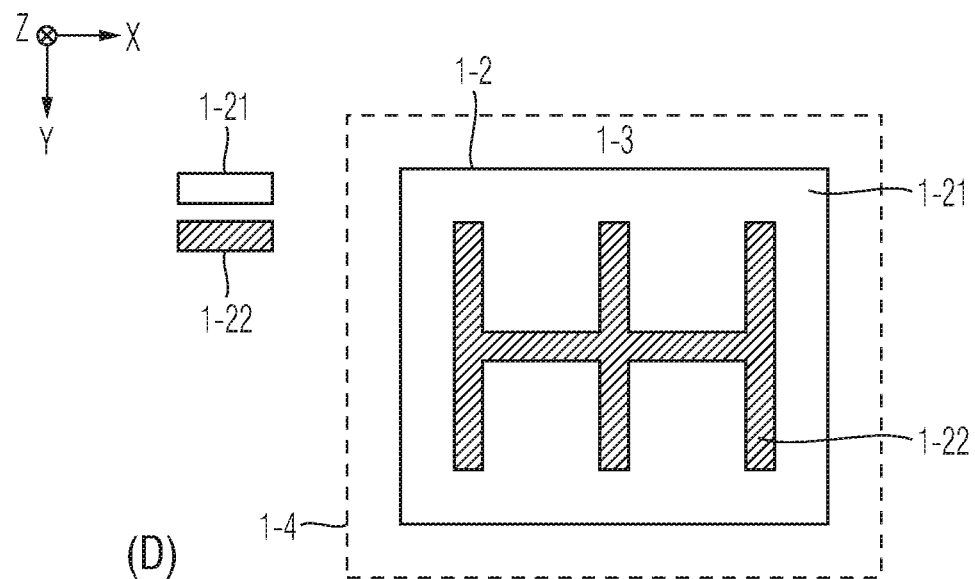
(D)
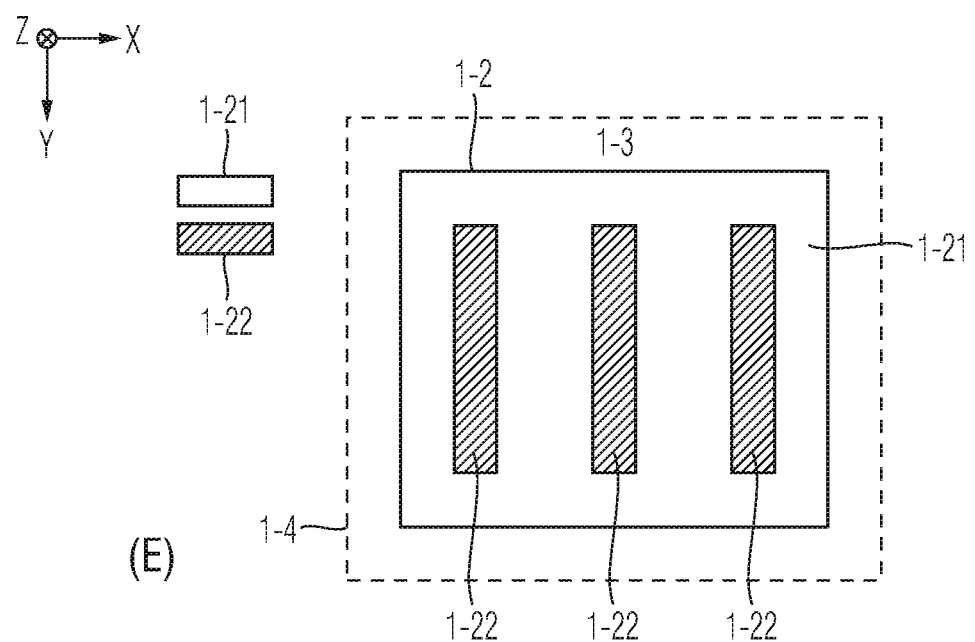
(E)

FIG 5 (CONTINUED)
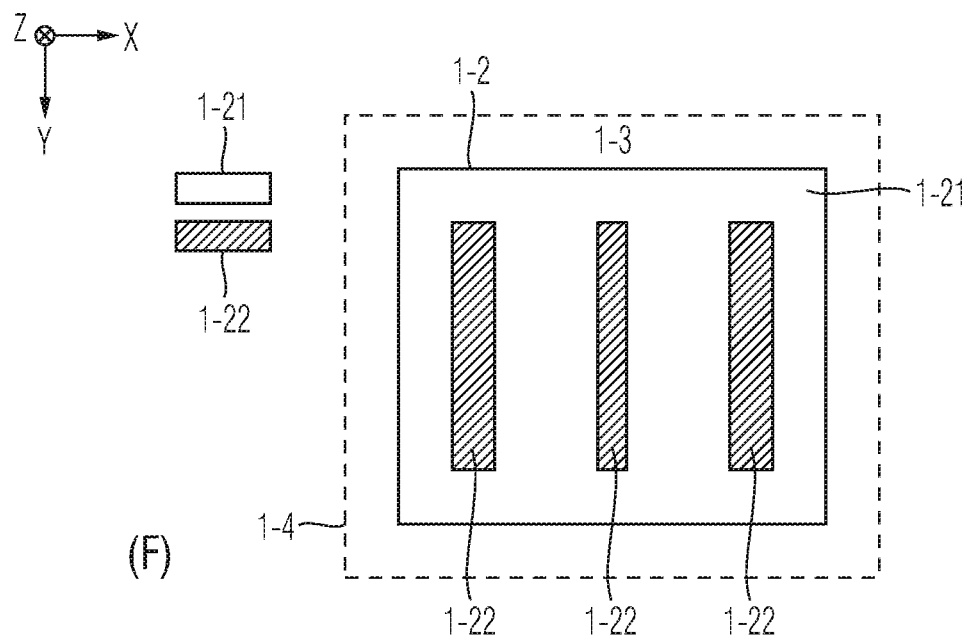
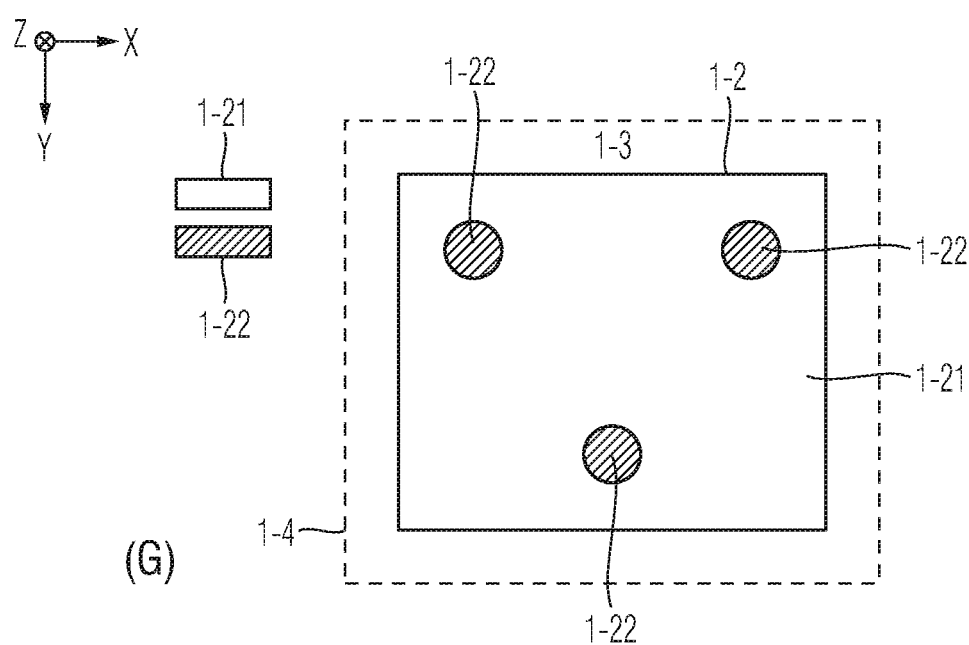

FIG 5 (CONTINUED)
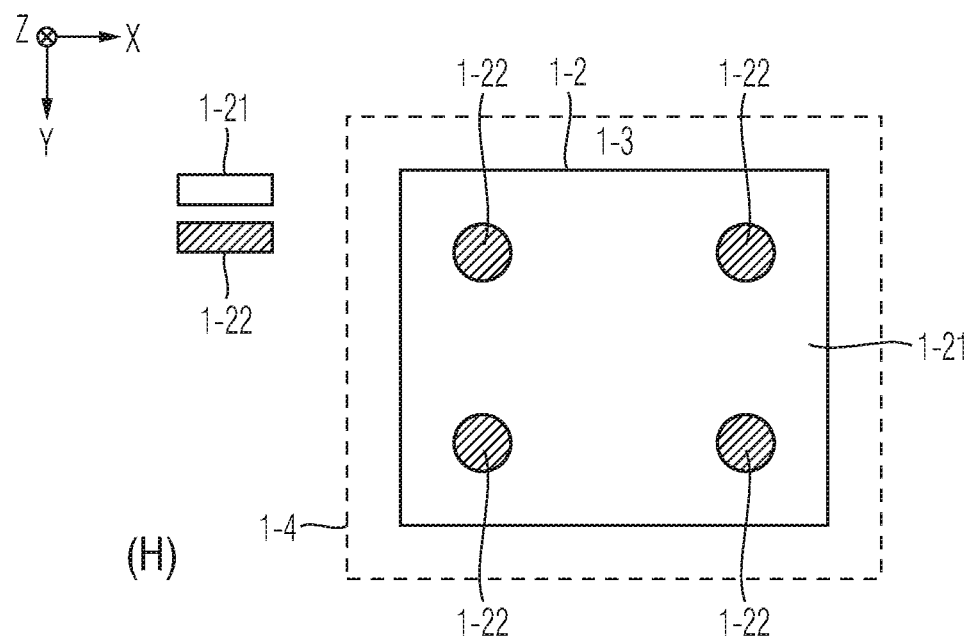
(H)
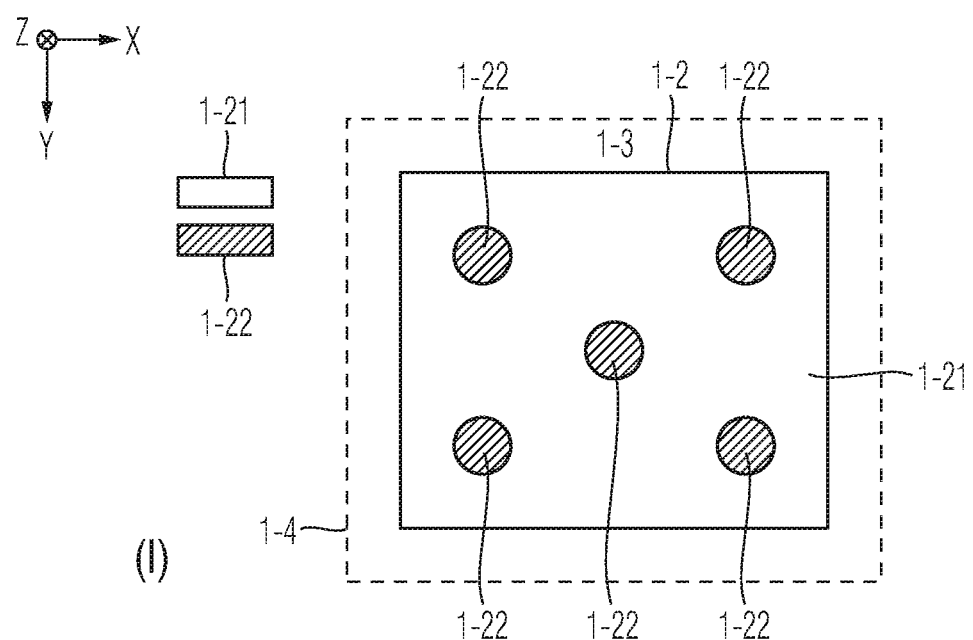
(I)

FIG 5 (CONTINUED)
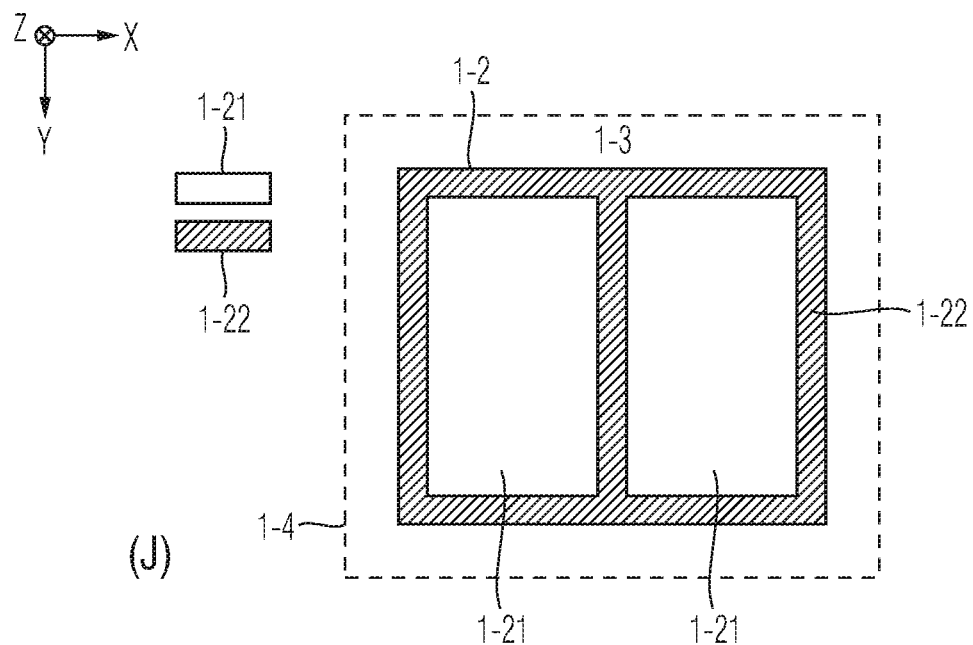
(J)
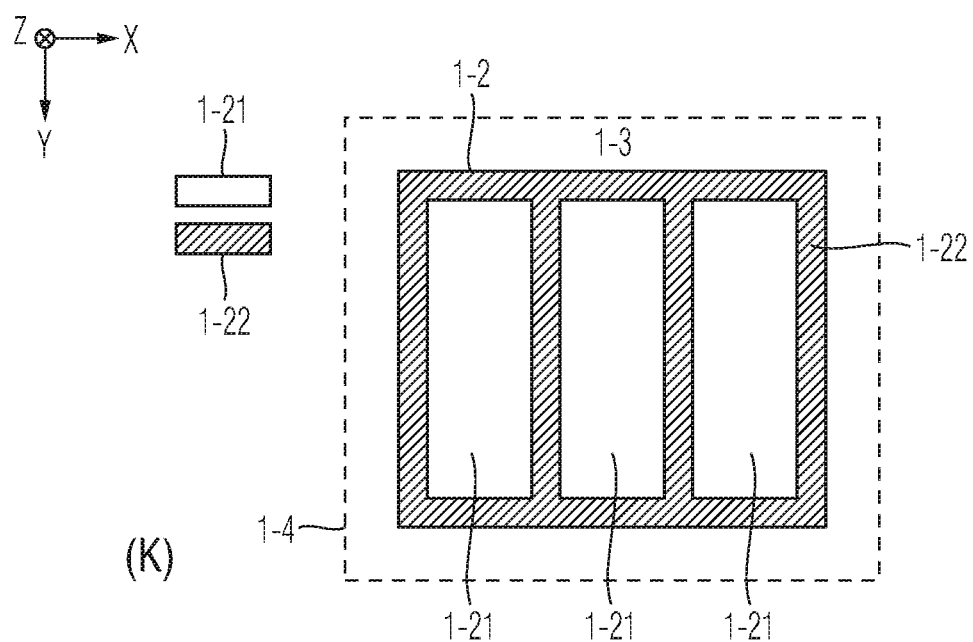
(K)

FIG 5 (CONTINUED)
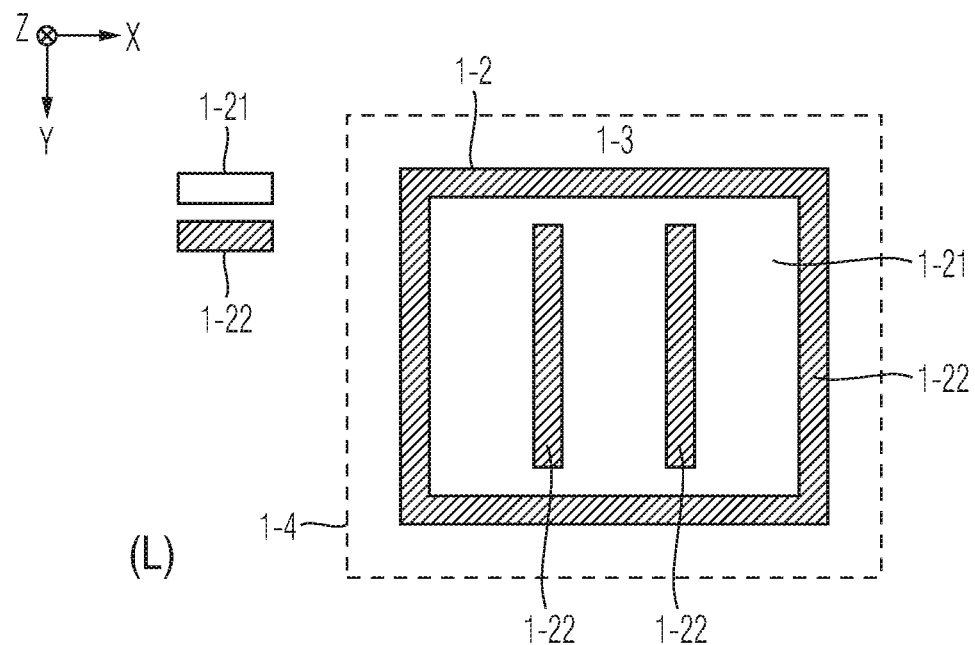
(L)
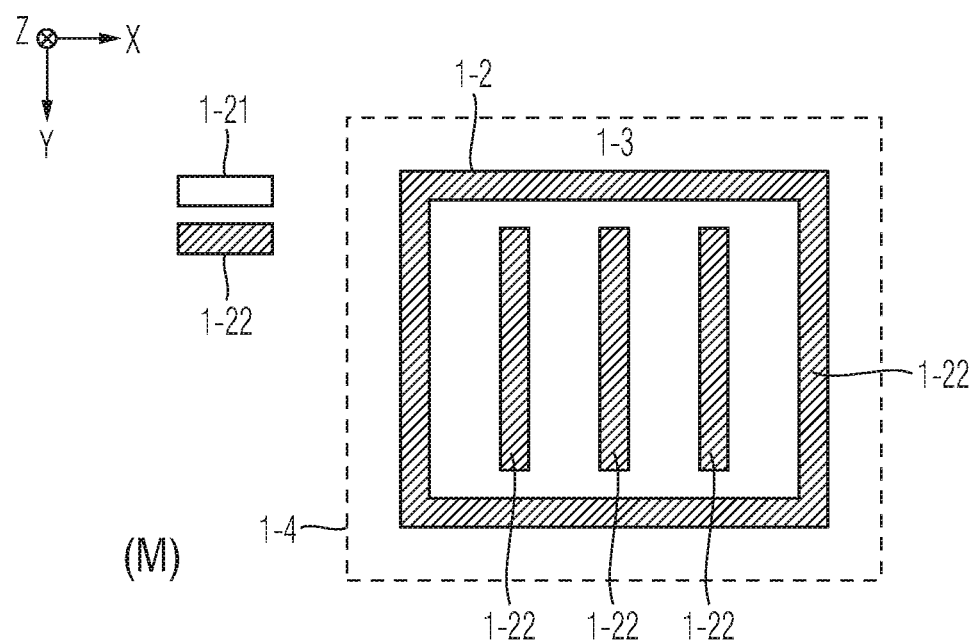
(M)

FIG 5 (CONTINUED)
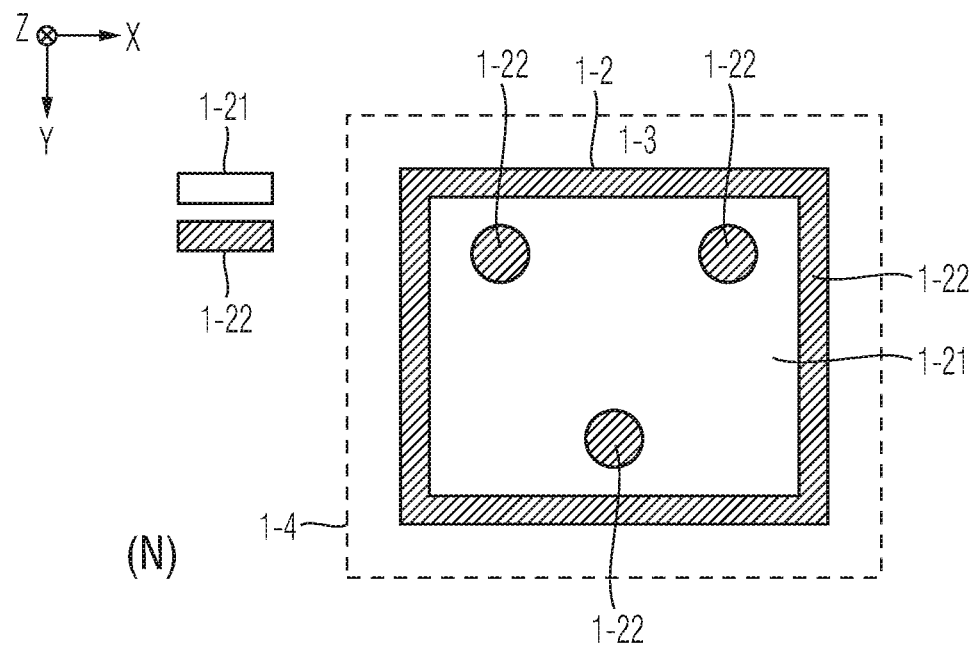
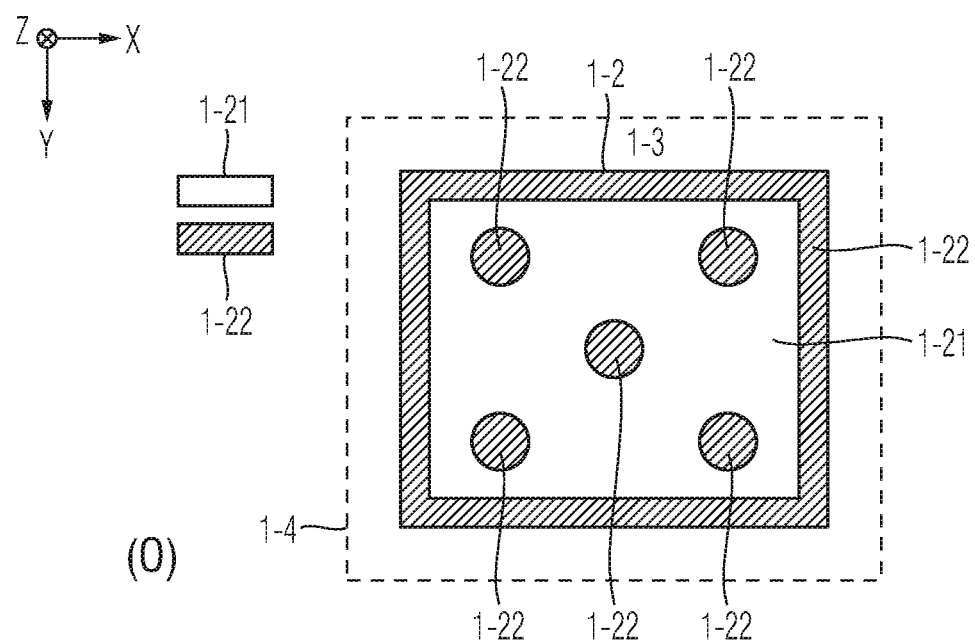

FIG 11
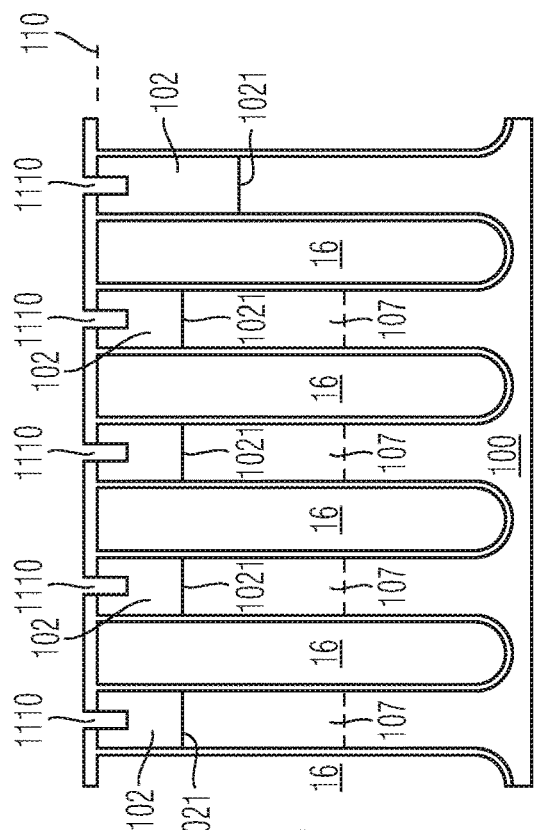
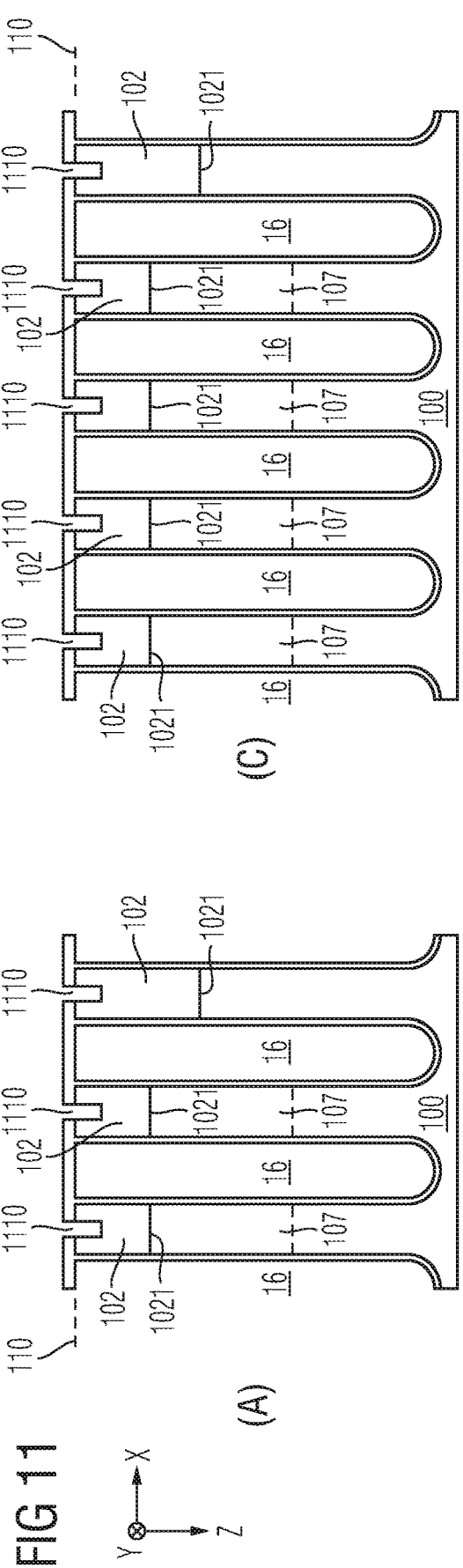
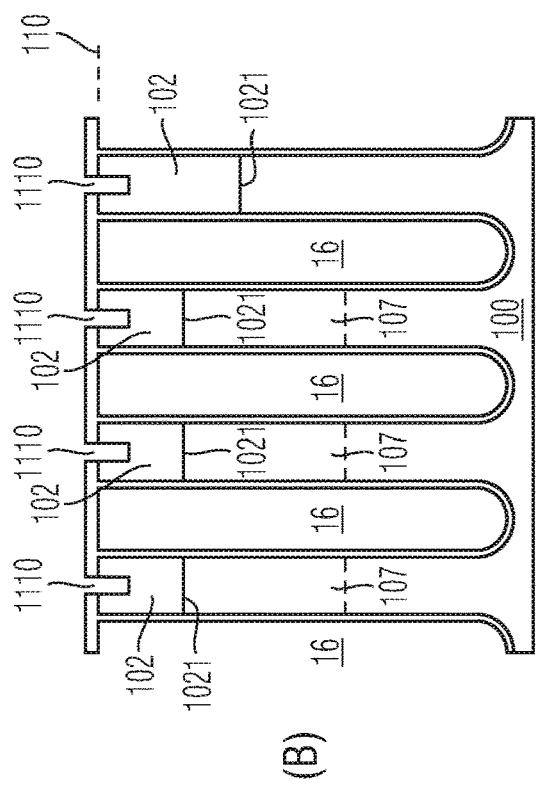

DIODE WITH STRUCTURED BARRIER REGION

TECHNICAL FIELD

This specification refers to embodiments of a power semiconductor device and to embodiments of a method of processing a power semiconductor device. In particular, this specification is related to embodiments of a diode section (e.g., in an RC IGBT or in a diode) and to embodiments of a corresponding processing method, wherein the diode section has a laterally structured highly doped barrier region between the body region and the drift region.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

Some power semiconductor device further provide for a reverse conductivity; during a reverse conducting state, the power semiconductor device conducts a reverse load current. Such devices may be designed such that the forward load current capability (in terms of magnitude) is substantially the same as the reverse load current capability.

A typical device that provides for both forward and reverse load current capability is the reverse conducting (RC) IGBT, the general configuration of which is known to the skilled person. Typically, for an RC IGBT, the forward conducting state is controllable by means of providing a corresponding signal to the gate electrodes, and the reverse conducting state is typically not controllable, but the RC IGBT assumes the reverse conducting state if a reverse voltage is present at the load terminals due to a corresponding diode structure in the RC IGBT.

It is of course possible to provide a reverse current capability by means of a separate diode; e.g., a diode connected anti-parallel to a regular (no reverse conducting) IGBT.

A typical design goal for a diode, irrespective of whether the diode is provided as a separate diode or as a diode section in a reverse conducting transistor, is to obtain a specific anode injection efficiency.

SUMMARY

According to an embodiment, a power semiconductor device comprises: an active region with a diode section; an edge termination region surrounding the active region; a semiconductor body having a frontside and a backside; a first load terminal at the semiconductor body frontside and a second load terminal at the semiconductor body backside, wherein the diode section is configured for conduction of a diode load current between the first load terminal and the second load terminal; a drift region of a first conductivity type formed in the semiconductor body and extending into the diode section; a plurality of trenches arranged in the diode section, each trench extending from the frontside along the vertical direction into the semiconductor body and comprising a trench electrode isolated from the semiconductor body by a trench insulator, wherein two adjacent trenches define a respective mesa portion in the semiconductor body; a body region of a second conductivity type formed in the mesa portions of the semiconductor body and being electrically connected to the first load terminal; in the diode section, a barrier region of the first conductivity between the body region and the drift region, wherein the barrier region has a dopant concentration at least 100 times greater than the average dopant concentration of the drift region and a dopant dose greater than a dopant dose of the body region. The barrier region has a lateral structure according to which at least 50% of the body region in the diode section is coupled to the drift region at least by means of the barrier region; and at least 5% of the body region in the diode section is coupled to the drift region without the barrier region.

According to another embodiment, a method of processing a power semiconductor device comprises forming: an active region with a diode section; an edge termination region surrounding the active region; a semiconductor body having a frontside and a backside; a first load terminal at the semiconductor body frontside and a second load terminal at the semiconductor body backside, wherein the diode section is configured for conduction of a diode load current between the first load terminal and the second load terminal; a drift region of a first conductivity type formed in the semiconductor body and extending into the diode section; a plurality of trenches arranged in the diode section, each trench extending from the frontside along the vertical direction into the semiconductor body and comprising a trench electrode isolated from the semiconductor body by a trench insulator, wherein two adjacent trenches define a respective mesa portion in the semiconductor body; a body region of a second conductivity type formed in the mesa portions of the semiconductor body and being electrically connected to the first load terminal; in the diode section, a barrier region of the first conductivity between the body region and the drift region, wherein the barrier region has a dopant concentration at least 100 times greater than the average dopant concentration of the drift region and a dopant dose greater than a dopant dose of the body region. The barrier region has a lateral structure according to which at least 50% of the body region in the diode section is coupled to the drift region at least by means of the barrier region; and at least 5% of the body region in the diode section is coupled to the drift region without the barrier region.

For example, the diode section mentioned herein is not integrated into an IGBT section; e.g., the mesa portions in the diode section do not comprise one or more source regions of the first conductivity type electrically connected to the first load terminal.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIG. 11 schematically and exemplarily illustrates some variants, in a respective section of a vertical cross-section, of a power semiconductor device in accordance with one or more embodiments.

DETAILED DESCRIPTION

Figure 1:
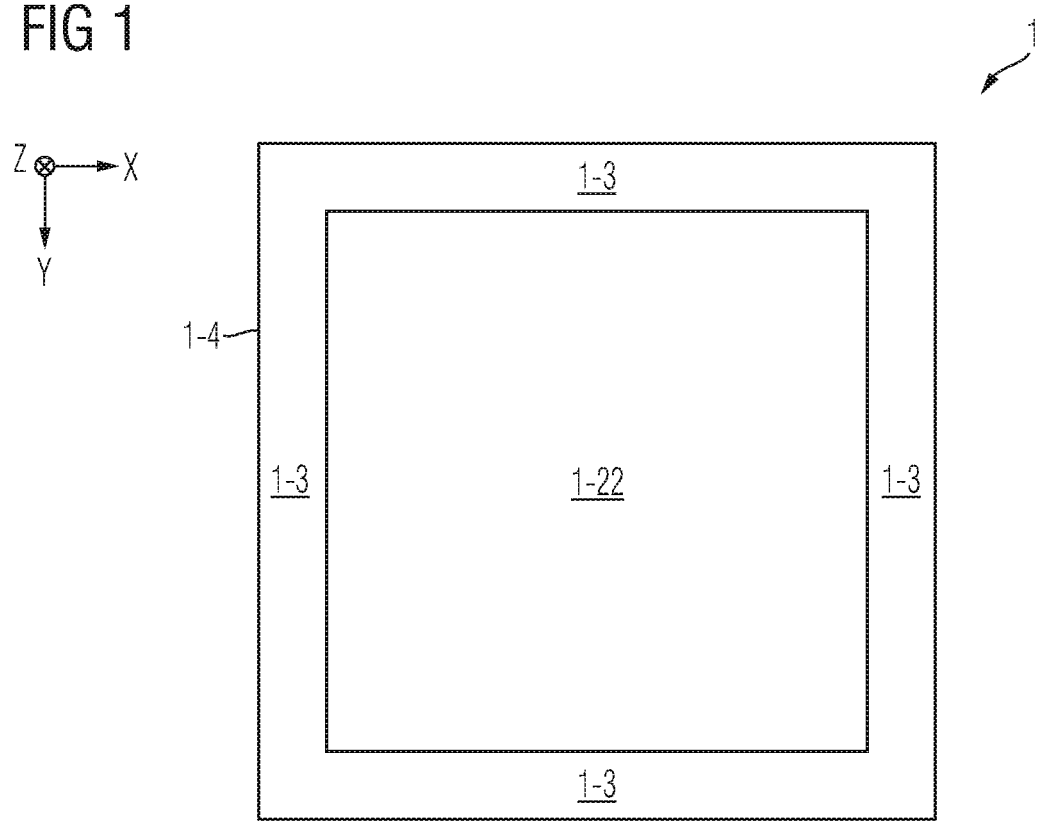
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a diode or an RC IGBT, exhibiting a stripe cell configuration, e.g., a power semiconductor device that may be used within a power converter or a power supply. Thus, in an embodiment, such power semiconductor device can be configured to carry a load current that is to be fed to a load and/or, respectively, that is provided by a power source. For example, the power semiconductor device may comprise a plurality of power semiconductor cells, such as monolithically integrated diode cells, derivatives of a monolithically integrated diode cell, monolithically integrated IGBT cells and/or derivatives thereof. Such diode/transistor cells may be integrated in a power semiconductor module. A plurality of such cells may constitute a cell field that is arranged within an active region of the power semiconductor device.

The term "power semiconductor device" as used in this specification intends to describe a power semiconductor device on a single chip with high voltage blocking and/or high current-carrying capabilities. In other words, embodiments of the power semiconductor device described herein are single chip power semiconductor devices (e.g., RC IGBTs or diodes) configured for high current, typically in the Ampere range, e.g., up to several Ampere or up to several ten or hundred Ampere, and/or high voltages, typically 100 V and above, e.g., up to at least 400 V or even more, e.g., up to at least 3 kV, or even up to 10 kV or more.

For example, the power semiconductor device described below may be single chip power semiconductor device exhibiting a stripe cell configuration and configured to be employed as a power component in a low-, medium- and/or high voltage application. Several single chip power semiconductor devices may be integrated in a module so as to form a power semiconductor module, e.g., an RC IGBT module or a diode module, e.g., for installation and use in a low-, medium- and/or high voltage application, such as major home appliances, general purpose drive, electric-drive train, servo drives, traction, higher power transmission facilities, etc.

For example, the term "power semiconductor device" as used in this specification is not directed to a logic semiconductor device used for, e.g., storing data, computing data and/or other types of semiconductor based data processing.

FIG. 1 schematically and exemplarily illustrates, in a simplified manner, a horizontal projection of a power semiconductor device 1 in accordance with one or more embodiments. The power semiconductor device 1 can for example be a single chip diode. In another embodiment, the power semiconductor device 1 is a single chip RC IGBT.

For describing the configuration of the power semiconductor device 1, it will also be referred to FIGS. 2-5 in the following.

The power semiconductor device 1 comprises an active region 1-2 with a diode section 1-22 and, optionally, an IGBT section 1-21.

An edge termination region 1-3 surrounds the active region 1-2. Hence, the edge termination region 1-3 is arranged external of the active region 1-2. The edge termination region 1-3 is laterally terminated by an edge 1-4. The edge 1-4 may form the chip edge of the power semiconductor device 1.

As used herein, the terms "edge termination region" and "active region" are both associated with the respective technical meaning the skilled person typically associates therewith in the context of power semiconductor devices, such as diodes and RC IGBTs. That is, the active region 1-2 is primarily configured for forward (and optionally reverse) load current conduction and, optionally, switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

The present specification primarily relates to the active region 1-2.

Figure 5:
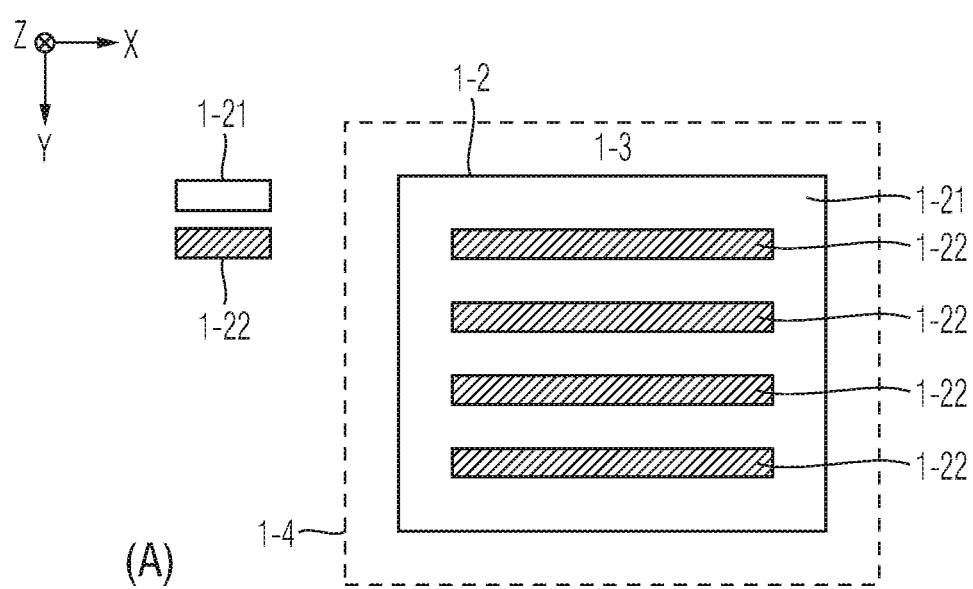
FIG. 5 schematically and exemplarily illustrates some variants, in a respective horizontal projection, of one or more diode sections and one or more IGBT sections of a power semiconductor device in accordance with one or more embodiments.

As illustrated in FIG. 5, if implemented as an RC IGBT, the power semiconductor device 1 can comprise a plurality of substantially equally configured IGBT sections 1-21 and a plurality of substantially equally configured diode sections 1-22.

The different sections 1-21 and 1-22 may be laterally distributed within the active region 1-2, a few schematic examples being illustrated in FIGS. 1 and 5.

In an embodiment, the active region 1-2 consists of one or more diode sections 1-22 and zero or more IGBT sections 1-21.

But, it shall be understood that, in accordance with one or more embodiments described herein, the diode section 1-22 is not integrated into the IGBT section 1-21; e.g., the mesa portions (reference numeral 17) in the diode section 1-22 do not comprise one or more source regions (reference numeral 101) of the first conductivity type electrically connected to the first load terminal (reference numeral 11).

For example, the diode section(s) 1-22, that are not integrated into IGBT section(s) 1-21 and that or not electrically connected to the first load terminal 11 via source regions 101 of the first conductivity type, make up a significant portion, e.g., a major portion of the active region 1-2. Hence, each of the diode section(s) 1-22 mentioned herein may be "large-diode-only" portions of the active region 1-2, in accordance with an embodiment.

In accordance with the variant illustrated in FIG. 1, the active region 1-2 comprises or, respectively, consists of one diode section 1-22. In accordance with FIG. 5, the active region 1-2 additionally has one or more IGBT sections 1-21. For example, in accordance with variants (A), (B), (E), (F), (L) and (M), two or four (or more or less) stripe like diode sections 1-22 are embedded in one IGBT section 1-21 that interfaces with the edge termination region 1-3. The stripe like diode sections 1-22 may vary in size (e.g., width and/or length) and orientation. Also, a combination of differently orientated stripe like diode sections 1-22 is possible, as exemplarily illustrated in variants (C) and (D), e.g., such that a contiguous diode section 1-22 having a H-structure or a derivative thereof is achieved. In other embodiments, one or more circle like diode sections 1-22 are embedded into one IGBT section 1-21, as illustrated in variants (G), (H), (I), (N) and (O). In other embodiments, one or more, e.g., stripe like IGBT sections 1-21 are embedded into a contiguous diode section 1-22, as illustrated in variants (J) and (K). In addition to stripe like diode sections 1-22 embedded in one contiguous IGBT section 1-21, said IGBT section 1-21 can also be surrounded by an additional, frame like diode section 1-22 that interfaces with the edge termination region 1-3, cf. variants (L), (M), (N) and (O).

Irrespective of the chosen lateral-spatial distribution of the IGBT sections 1-21, diode sections 1-22 and corresponding transition sections, it may be ensured that, with respect to a volume of the active region 1-2, the ratio between the total of the IGBT section(s) 1-21 and the total of the diode section(s) 1-22 is at least 1.5:1, or respectively, at least 2:1, i.e., larger or equal than 2:1. The chosen ratio may depend on the application in which the power semiconductor device 1 is employed. In an embodiment, at least 75% of the total volume of the active region 1-2 may be occupied for forming the IGBT section(s), and the remaining 25% (or a lower percentage share) of the active region 1-2 may be employed for forming the diode section(s) 1-22. Irrespective of the chosen lateral-spatial distribution of the IGBT sections 1-21 and diode sections 1-22, it may be ensured that, with respect to a volume of the active region 1-2, the ratio between the IGBT section(s) 1-21 and the diode section(s) 1-22 is even larger than 3:1, in accordance with an embodiment.

In the following, reference will be made to "the" diode section 1-22 and "the" IGBT section 1-21. It shall be understood that the explanation provided below with respect to these sections 1-21 and 1-22 may apply to each section 1-21 or, respectively, 1-22 that are provided in the active region 1-2. For example, if zero or more IGBT sections 1-21 are provided, each IGBT section 1-21 may be equally configured (wherein, for example, the IGBT sections 1-21 may differ in total lateral extension or exhibit identical total lateral extensions). Accordingly, if a plurality of diode sections 1-22 is provided, each diode section 1-22 may be equally configured (wherein, for example, the diode sections 1-22 may differ in total lateral extension or exhibit identical total lateral extensions).

Figure 2:
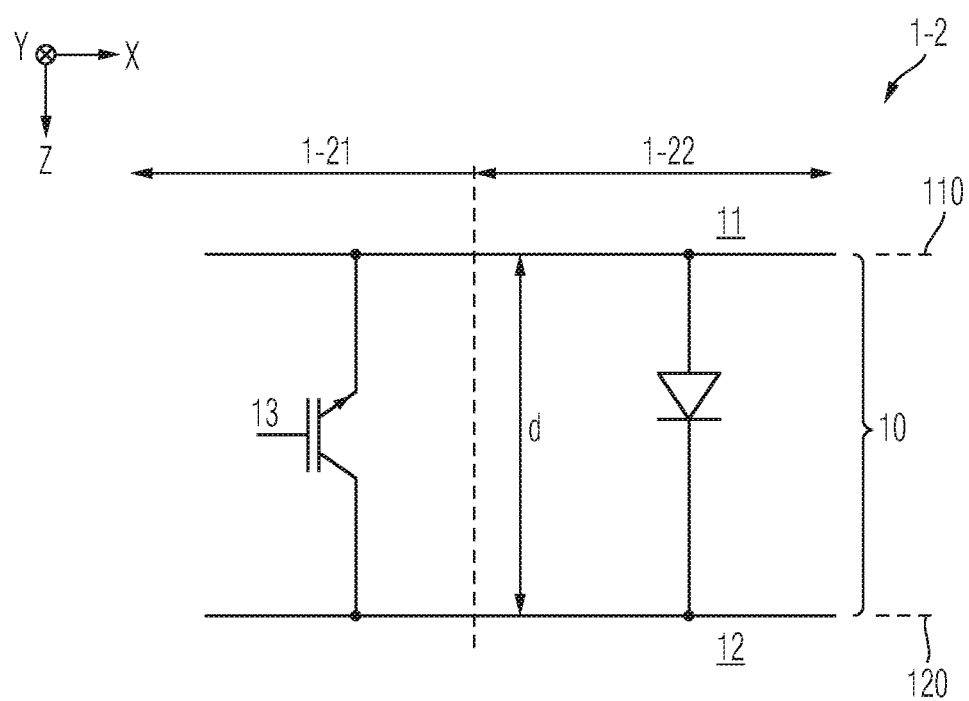
FIG. 2 schematically and exemplarily illustrates a simplified design of a power semiconductor device in accordance with one or more embodiments.

Now focusing also on FIG. 2, a semiconductor body 10 of the power semiconductor device 1 has a frontside 110 and a backside 120. The frontside 110 and the backside 120 may vertically terminate the semiconductor body 10. Hence, a thickness d of the semiconductor body 10 is defined as the distance along a vertical direction Z between the frontside 110 and the backside 120. In the lateral directions, the semiconductor body 10 may be terminated by the edge 1-4 (cf. FIG. 1 and FIG. 5). Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness d of the semiconductor body 10 may be the distance between the frontside 110 and the backside 120 along the vertical direction Z in the active region 1-2, e.g., measured at a center of the active region 1-2.

In an embodiment, a total lateral extension of the IGBT section 1-21 (if present) amounts to at least 50% of the semiconductor body thickness d. The total lateral extension of the IGBT section 1-21 may also be greater than 50% of the thickness d, e.g., greater than 2*d, or even greater than 2.5*d.

In an embodiment, a total lateral extension of the diode section 1-22 amounts to at least 20% of the semiconductor body thickness d. The total lateral extension of the diode section 1-22 may also be greater than 30% of the thickness d, e.g., greater than 0.5*d, or even greater than d. For example, the area of the horizontal cross-section of the diode section 1-22 has a minimum lateral extension amounting at least to the semiconductor body thickness d.

A first load terminal 11 is at the semiconductor body frontside 110 and a second load terminal 12 is at the semiconductor body backside 120.

If present, the IGBT section 1-21 is configured for conduction of a forward load current between the first load terminal 11 and the second load terminal 12, e.g., if the electrical potential at the second load terminal 12 is greater than the electrical potential at the first load terminal 11.

The diode section 1-22 is configured for conduction of a diode load current between the first load terminal 11 and the second load terminal 12, e.g., if the electrical potential at the second load terminal 12 is lower than the electrical potential at the first load terminal 11. If both the diode section 1-22 and the IGBT section 1-21 are implemented in the active region 1-2 of the power semiconductor device 1, an RC-IGBT is formed, and the diode load current can hence be considered as a reverse load current. However, it is again emphasized that embodiments encompass also variants where the active region 1-2 is equipped with one or more diode sections 1-22, only, and not with any IGBT sections 1-21. In the later cases, the power semiconductor device 1 is, hence, a power semiconductor diode.

In an embodiment, the diode section 1-22, which conducts the diode load current, can be spatially separated from the IGBT section 1-21, which conducts the forward load current. As indicated above, the diode section 1-22 is not part of the IGBT section 1-21, but separate therefrom, and does also not include any source region 101 of the first conductivity type electrically connected to the first load terminal 11; rather, the diode section 1-22 is a large diode-only region of the active region 1-2, in accordance with some embodiments.

Furthermore, in an embodiment, the diode section 1-22 is independent from a control signal (e.g., the control signal provided to control electrodes 141 mentioned below). This means, that the diode section 1-22 may be configured such that it conducts the diode load current as soon as the electrical potential (of the typical polarity) at the second load terminal 12 is lower (at least by the diode section internal threshold voltage) than the electrical potential at the first load terminal 11, irrespective of the control signal provided to the IGBT section 1-21 (if present at all).

If implemented as an RC IGBT, the power semiconductor device 1 may further comprise a control terminal 13 for controlling the forward load current. The control terminal 13 may also be arranged at the frontside 110.

In accordance with the terminology typically associated with RC IGBTs, the control terminal 13 can be a gate terminal, the first load terminal 11 can be an emitter (source) terminal and the second load terminal 12 can be a collector (drain) terminal.

In accordance with the terminology typically associated with diodes (where the control terminal 13 is not necessarily present), the first load terminal 11 can be an anode terminal and the second load terminal 12 can be a cathode terminal.

For example, the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. For example, as exemplary illustrated in FIGS. 3 and 4, said local contacts can be established by means of contact plugs 111 penetrating an insulation structure 13 so as to contact mesa portions 17.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 laterally overlaps with the edge termination region 1-3.

For example, the lateral boundary of the active region 1-2 is defined by the lateral boundary of the outermost power cell(s) of the diode section(s) 1-22 and/or (if present) IGBT section(s) 1-21. Hence, the lateral boundary of the active region 1-2 may be defined at the frontside 110. For example, if implemented as RC IGBT, this lateral boundary can be defined by an outermost source region(s) 101 (cf. explanation in more detail below). For example, all functional elements to enable conduction of the diode load current (and, optionally) the forward (IGBT) load current are present in a vertical projection of the active region 1-2 of the power semiconductor device 1, e.g., including at least the first load terminal 11 (e.g., a frontside metal contact thereof, e.g., one or more of the contact plugs 111), source region(s) 101, a body region 102, a drift region 100, a IGBT emitter region 103, a diode cathode region 104 and the second load terminal 12 (e.g., a backside metal thereof), as will be explained in more detail below.

In an embodiment, the edge termination region 1-3 and the active region 1-2 may be symmetrically arranged to each other, e.g., with respect to a central vertical axis of the power semiconductor device 1.

Furthermore, the lateral transition between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be observed at the backside 120, wherein the second load terminal 12 at the backside 120 is, e.g., laterally unstructured but homogeneously formed.

Figure 3:
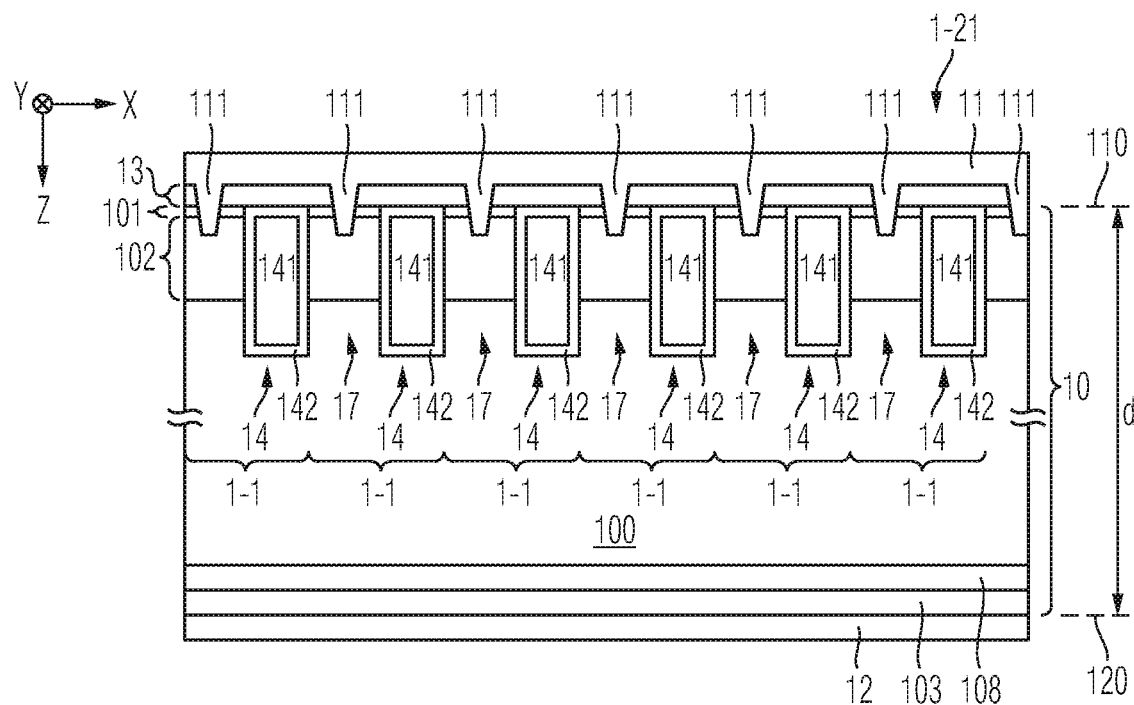
FIG. 3 schematically and exemplarily illustrates a section of a vertical cross-section of a diode section of a power semiconductor device in accordance with some embodiments.
Figure 4:
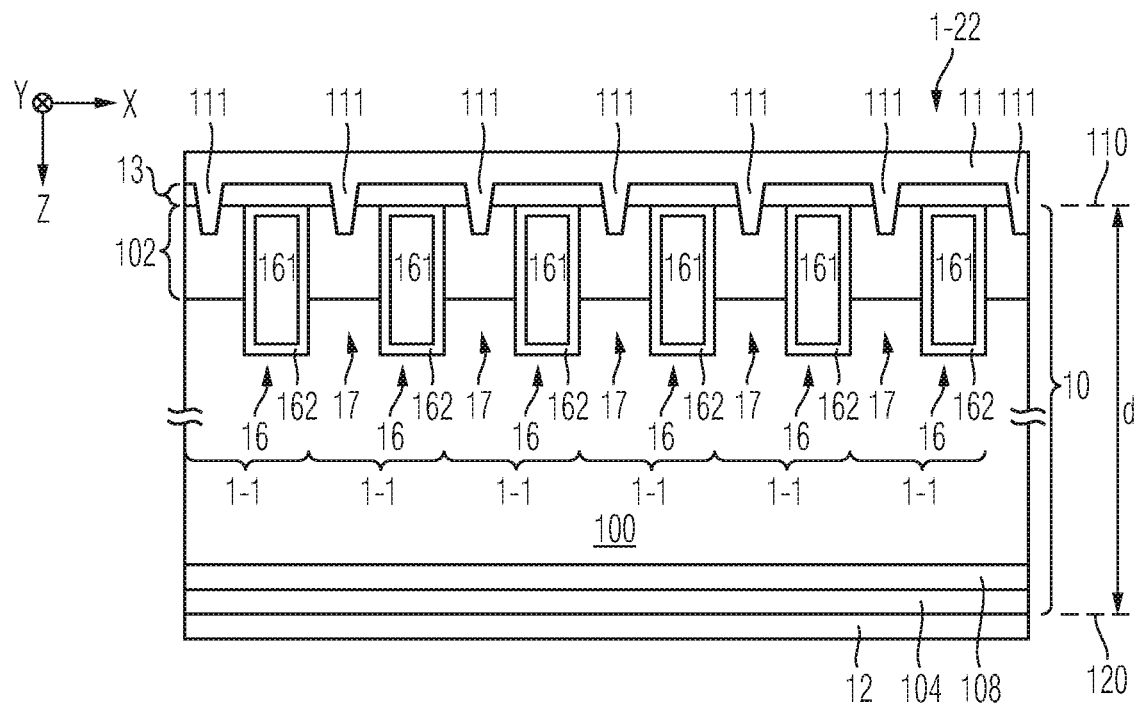
FIG. 4 schematically and exemplarily illustrates a section of a vertical cross-section of an IGBT section of a power semiconductor device in accordance with some embodiments.
Figure 6:
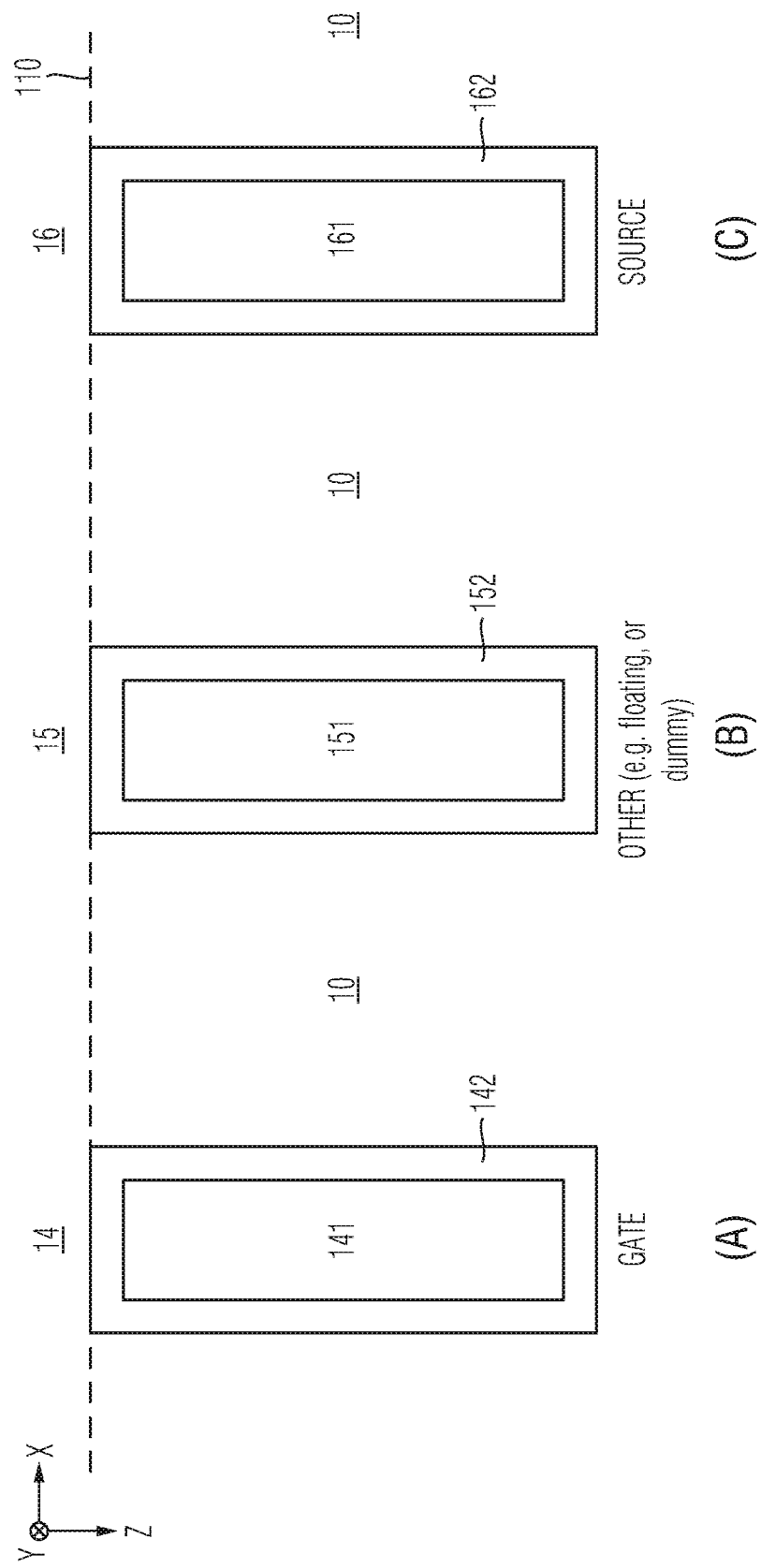
FIG. 6 schematically and exemplarily illustrates vertical cross-sections of different trench types that may be part of a power semiconductor device in accordance with one or more embodiments.

Now also referring to FIGS. 3, 4 and 6, a plurality of trenches 14, 15, 16 is arranged in the diode section 1-22 and, if present, also in the IGBT section 1-21. Each trench 14, 15, 16 extends from the frontside 110 along the vertical direction Z into the semiconductor body 10 and comprises a respective trench electrode 141, 151, 161 isolated from the semiconductor body 10 by a respective trench insulator 142, 152, 162, wherein two adjacent trenches define a respective mesa portion 17 in the semiconductor body 10.

Each trench 14, 15, 16 may have a stripe configuration, e.g., as best illustrated in one of the horizontal/perspective projections, e.g. in FIGS. 8-10 and 12, meaning that the respective trench length (e.g., along the second lateral direction Y) is much greater than the respective trench width (e.g., along the first lateral direction X).

As will be explained further below, different type of trenches may be provided in the sections 1-21 and/or 1-22.

A first type of trench can be the control trench 14, whose trench electrode 141 is electrically connected to the control terminal 13 and is hence referred to as control electrode 141.

A second type of trench can be the source trench 16, whose trench electrode 161 is electrically connected to the first load terminal 11 and is hence referred to as source electrode 161.

A third type of trench can be another trench 15, whose trench electrode 151 is neither electrically connected to the first load terminal 11 nor to the control terminal 13. For example, in one embodiment, trench 15 is a floating trench and trench electrode 151 is connected to no defined electrical potential, but electrically floating. In another embodiment, trench 15 is a dummy trench and trench electrode 151 is electrically connected to the control terminal 13 but does not directly control conduction of the forward load current as no electrically connected source region 101 (connected to the first load terminal) is arranged adjacent to trench 15. In yet another embodiment, the trench electrode 151 is connected to an electrical potential different from the electrical potential of the control terminal 13 and different from the electrical potential of the first load terminal 11.

Each trench type can be of equal dimensions in terms of width (along the first lateral direction X) and depth (along the vertical direction Z, e.g., distance between frontside 110 down to trench bottom) and/or length (along the second lateral direction Y).

If present, the IGBT section 1-21 may comprise a plurality of IGBT cells, each IGBT cell having a certain trench pattern, i.e., a lateral sequence of trenches of specific types, e.g. one or more control trenches 14, zero or more source trenches 16 and zero or more other trenches 15.

Analogously, the diode section 1-22 may comprise a plurality of diode cells, each diode cell having a certain trench pattern, i.e., a lateral sequence of trenches of specific types, e.g. one or more source trenches 16, zero or more other trenches 15 and zero or more control trenches 14.

As indicated above, in one embodiment, the trenches 14, 15, 16 are arranged in both the diode section 1-22 and the IGBT section 1-21. For example, the trenches 14, 15, 16 in both the IGBT section 1-21 and the diode section 1-22 are laterally arranged next to one another in accordance with the same lateral trench pitch; i.e., the lateral trench pitch (that is, the distance between two adjacent trenches) does not alter between the sections 1-21 and 1-22.

Irrespective of presence/absence of the IGBT section 1-21, the lateral trench pitch may define a lateral distance between two adjacent trenches of no more than 1/30 of the semiconductor body thickness d. For example, the lateral widths of the mesa portions 17 in both the diode section 1-22 and the IGBT section 1-21 may be identical to each other.

Also, the trenches 14, 15, 16 may each exhibit the same trench depth (total vertical extension). For example, the lateral trench pitch may define a lateral distance between two adjacent trenches of no more than 50% or no more than 30% of the trench depth.

In an embodiment, the lateral trench pitch may define a lateral distance between two adjacent trenches of no more than 10 μm, or no more than 5 μm, 1 or no more than 1 μm. For example, adjacent trenches are hence laterally displaced from each other by no more than 1 μm.

Hence, the width of each mesa portion 17 is within the range as defined by the lateral trench pitch.

As explained above, the lateral trench pitch may be identical for both sections 1-21 and 1-22. That means, that the average density of trench electrodes can be also be same for both sections 1-21 and 1-22. However, the trench pattern, e.g., the arrangement of the different types of trenches may vary between the sections 1-21 and 1-22. One exemplary variation is that the density of control electrodes 141 in the IGBT section 1-21 is at least twice as high as the density of control electrodes 141 in the diode section 1-22 (which may even amount to zero).

As used herein, the term "density" refers to the number of control electrodes 141 (or dummy electrodes 151 also connected to the control terminal 13) divided by the total number of trench electrodes present in the respective section 1-21, 1-22.

In an illustrative example, the total number of trench electrodes in the IGBT section 1-21 is 120, and 40 trench electrodes are control electrodes 141, yielding a control electrode density of 30%. For example, the total number of trench electrodes in the diode section 1-22 is 100, and no more than ten trench electrodes are control electrodes 141, yielding a control electrode density of no more than 10%.

In an embodiment, at least 50% of the trench electrodes of the trenches in the diode section 1-22 are electrically connected to the first load terminal 11, i.e., at least 50% of the trench electrodes of the trenches in the diode section 1-22 are trench electrodes 161 of source trenches 16.

For example, the trenches in the diode section 1-22 are either source trenches 16 or floating trenches 15, e.g., all the trenches in the diode section 1-22 are source trenches 16. Furthermore, all or some mesa portions 17 in the diode section 1-22 may be electrically connected to the first load terminal 11, e.g., by means of the contact plugs 111.

By contrast, the trench types in the (optional) IGBT section 1-21 may vary; in accordance with an embodiment, a subsequently repeating trench-mesa-pattern corresponding to "kGkSoSoSoS" may be employed for forming IGBT cells, one of which being illustrated in FIG. 7, wherein "k" denotes a mesa portion 17 connected to the first load terminal 11, "o" denotes a mesa portion 17 not connected to the first load terminal 11 (i.e., meaning the transition between the first load terminal 11 and the mesa portion 17 along the vertical direction Z is not conductive), "G" denotes a gate trench 14, and "S" denotes a source trench 16. Of course, different trench-mesa-patterns may be used in other embodiments. For example, a dummy trench 15 (which is identical to a gate trench arranged between non-contacted mesa portions 17) could be included in the pattern of the diode section 1-22 and/or in the pattern of the IGBT section 1-21.

Figure 7:
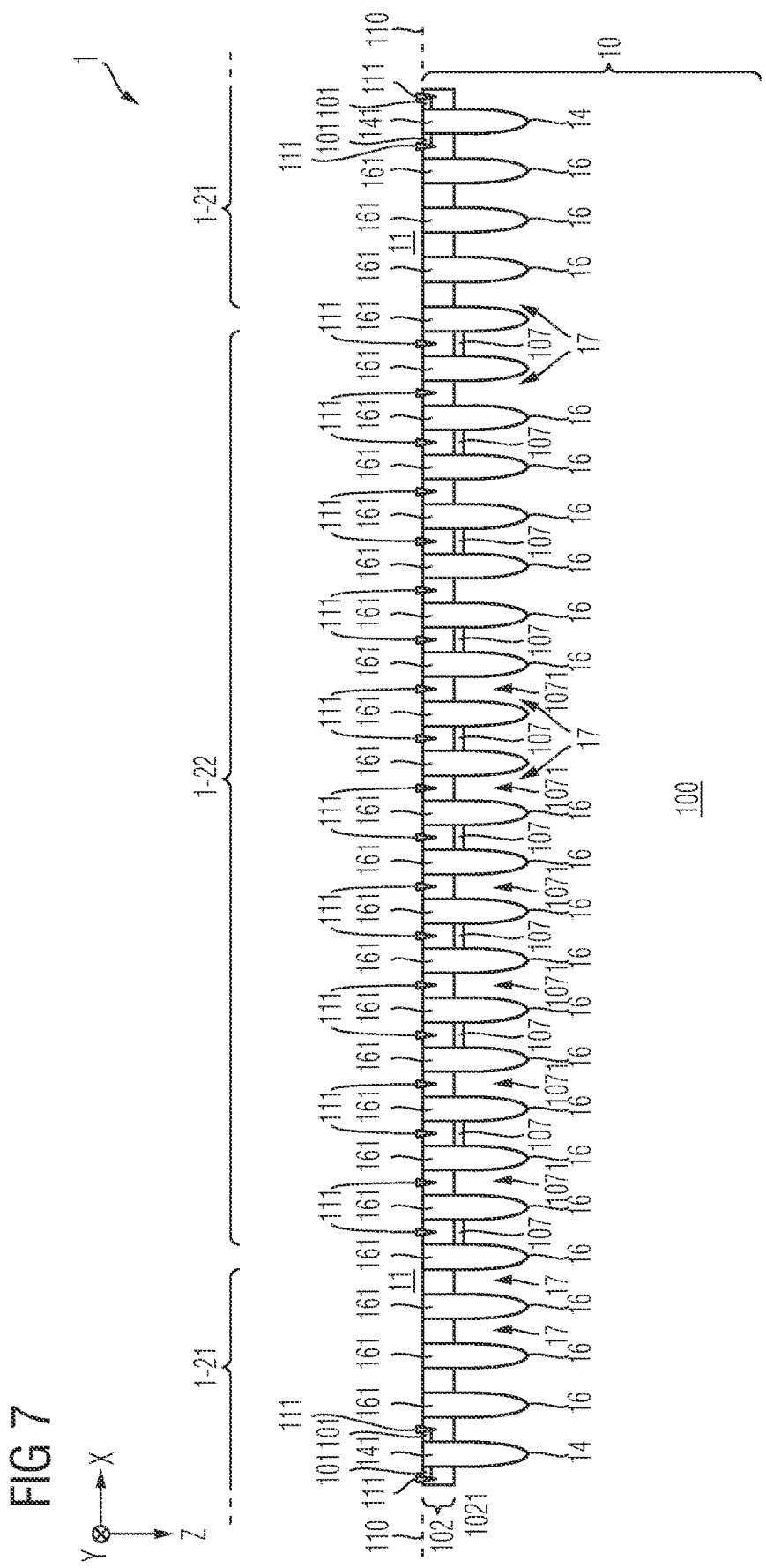
FIG. 7 schematically and exemplarily illustrates a section of a vertical cross-section of a power semiconductor device in accordance with some embodiments.

Still referring to FIGS. 3, 4 and 6, and additionally to FIG. 7, the power semiconductor device 1 further comprises a drift region 100 of the first conductivity type formed in the semiconductor body 10 and extending into the diode section 1-22 and, if present, also into the IGBT section 1-21.

A body region 102 of the second conductivity type is formed in the mesa portions 17 of the semiconductor body 10 and into the diode section 1-22 and, if present, also into the IGBT section 1-21. At least portions of the body region 102 are electrically connected to the first load terminal 11. The body region 102 may form pn-junctions to subsections of the mesa portions 17 of the first conductivity type. For example, as will be described below and as illustrated in the drawings (e.g. FIG. 7), in an embodiment, not in each mesa portion 17, the respective portion of the body region 102 is electrically connected to the first load terminal 11.

In the IGBT section 1-21, source regions 101 of the first conductivity type are arranged at the frontside 110 and electrically connected to the first load terminal 11. The source regions 101 are, e.g., only locally provided in the IGBT section 1-21 and do not, for example, extend into the diode section 1-22.

The body region 102 may be arranged in electrical contact with the first load terminal 11, e.g., by means of the contact plugs 111. In each IGBT cell of the IGBT section 1-21, there can furthermore be provided at least one source region 101 of the first conductivity type arranged in electrical contact with the first load terminal 11, e.g., also by means of the contact plugs 111. A major part of the semiconductor body 10 is formed as a drift region 100 of the first conductivity type, which may interface with the body region 102 and form a pn-junction 1021 therewith. The body region 102 isolates the source regions 101 from the drift region 100.

Upon receipt of a corresponding control signal, e.g., provided by a non-illustrated gate driver unit, each control electrode 141 can induce an inversion channel in a section of the body region 102 adjacent to the respective control electrode 141. Thus, each of the number of IGBT cells may be configured for conducting at least a portion of the forward load current between the first load terminal 11 and the second load terminal 12.

The above described basic configuration of the IGBT cells in the (optional) IGBT section 1-21 of the power semiconductor device 1 is as such known to the skilled person, and the present specification employs the term "IGBT cell" within the scope of the technical meaning the skilled person typically associates therewith.

In an embodiment, the drift region 100 extends along the vertical direction Z, until it interfaces with a field stop layer 108, wherein the field stop layer 108 is also of the first conductivity type, but exhibits a higher dopant dose as compared to the drift region 100. The field stop layer 108 is typically of significantly smaller thickness than the drift region 100.

The drift region 100, or, if present, the field stop layer 108, extends along the vertical direction Z until interfacing with either an IGBT emitter region 103 of the IGBT section 1-21 or a diode cathode region 104 of the diode section 1-22.

The diode cathode region 104 is of the first conductivity type and electrically connected to the second load terminal 12 and coupled to the drift region 100, e.g., by means of the field stop layer 108.

The IGBT emitter region 103 is of the second conductivity type and electrically connected to the second load terminal 12 and coupled to the drift region 100, e.g., by means of the field stop layer 108.

Both the IGBT emitter region 103 of the IGBT section 1-21 and the diode cathode region 104 of the diode section 1-22 can be arranged in electrical contact with the second load terminal 12.

Overall, the IGBT emitter region 103 may act as an emitter of the second conductivity type. Furthermore, though the power semiconductor device 1 can be implemented as an RC IGBT 1, the IGBT emitter region 103 does in some embodiments not comprise any section of the first conductivity type, which exhibit a rather high dopant concentration, typically in the range of $10^{16}$ cm$^{-3}$ to $10^{20}$ cm$^{-3}$, rather, the diode cathode region 104 is exclusively formed in the diode section 1-22, in accordance with some embodiments.

Again, it is emphasized that the power semiconductor device 1 can be implemented as a power semiconductor diode without any IGBT cell, i.e., without any source region 101, without any control trench 14 and without any IGBT emitter region 103.

In an embodiment, the average dopant concentration of the drift region 100 may be in the range of $10^{12}$ cm$^{-3}$ to $10^{14}$ cm$^{-3}$.

In an embodiment, the dopant concentration of each (optional) source region 101 may be in the range of $10^{19}$ cm$^{-3}$ to $10^{21}$ cm$^{-3}$.

In an embodiment, the dopant concentration of each body region 102 may be in the range of $10^{16}$ cm$^{-3}$ to $10^{18}$ cm$^{-3}$.

In an embodiment, the dopant concentration of the (optional) field stop layer 108 may be in the range of $10^{14}$ cm$^{-3}$ to $3*10^{16}$ cm$^{-3}$.

In an embodiment, the dopant concentration of the (optional) IGBT emitter region 103 may be in the range of $10^{16}$ cm$^{-3}$ to 10$^{18}$ cm$^{-3}$. However, in an embodiment, the dopant concentration may vary along the lateral extension of the IGBT emitter region 103.

In an embodiment, the dopant concentration of the diode cathode region 104 may be in the range of 10$^{19}$ cm$^{-3}$ to 10$^{21}$ cm$^{-3}$. However, in an embodiment, the dopant concentration may vary (and even change is polarity) along the lateral extension of the diode cathode region 104.

It shall be noted that the trench patterns illustrated in FIGS. 3 and 4 are only exemplary; other trench patterns will be described with respect to other drawings.

In an embodiment, the diode section 1-22 is not equipped with source regions 101; e.g., in the diode section 1-22, there is no doped semiconductor region of the first conductivity type electrically connected to the first load terminal. Rather, for forming the diode configuration in the diode section 1-22 for conduction of the diode load current, only the body region 102 is electrically connected to the first load terminal 11, wherein the body region 102 forms a pn-junction with, e.g., the drift region 100 (or, a barrier region 107 as described further below), and along the vertical direction Z towards the second load terminal 12, there is a semiconductor path of only the first conductivity type, not interrupted by any further regions of the second conductivity type.

As explained above, in contrast to the diode section 1-22, the optional IGBT section 1-21 comprises at least one IGBT cell with a section of the source region 101 connected to the first load terminal 11 and arranged adjacent to one of the control trenches 14 and isolated from the drift region 100 (or, if present, the yet further barrier region 106) by the body region 102, in accordance with an embodiment. For example, the lateral boundary of the IGBT section 1-21 is defined by the lateral boundary of the outermost IGBT cell(s). Hence, the lateral boundary of the IGBT section 1-21 may be defined at the frontside 110. This lateral boundary can be defined by (an) outermost source region(s) 101. For example, all functional elements to enable conduction of the forward load current are present in a vertical projection of the IGBT section 1-21 of the power semiconductor device 1, e.g., including at least the first load terminal 11 (e.g., a frontside metal contact thereof, e.g., one or more of the contact plugs 111), the source region(s) 101, the body region 102, the drift region 100, the IGBT emitter region 103, and the second load terminal 12 (e.g., a backside metal thereof). Furthermore, said functional elements may extend along the total lateral extension of the IGBT section 1-21.

In an embodiment, said contact plugs 111 are part of a contact plug structure 111 of the power semiconductor device 1. Each contact plug 111 can be configured to establish contact with a respective mesa portion 17 so as to electrically connect that respective mesa portion 17 to the first load terminal 11. As illustrated, each contact plug 111 may extend from the frontside 110 along the vertical direction Z into the respective mesa portion 17. Further exemplary aspects of the contact plug structure will be described below.

Now referring in more detail to FIG. 7, the power semiconductor device 1 comprises, in the diode section 1-22 (and irrespective of presence/absence of the optional IGBT section 1-21), a barrier region 107 of the first conductivity between the body region 102 and the drift region 100.

The barrier region 107 has a dopant concentration at least 100 times greater than the average dopant concentration of the drift region 100. For example, the barrier region 107 has a peak dopant concentration at least 100 times greater than the average dopant concentration of the drift region 100. For example, the average dopant concentration of the drift region 100 is determined in a section of the drift region 100 below the trench bottoms.

Furthermore, the barrier region 107 has a dopant dose greater than a dopant dose of the body region 102; e.g., the barrier region dopant dose is greater than 1.5*the body region dopant dose.

Here, it shall be noted that the dopant concentrations mentioned in the preceding paragraphs are both related to the dopant concentration of dopants of the first conductivity type; e.g., the barrier region 107 is an n-barrier region 107, and the drift region 100 is an n-drift region 100. By contrast, the dopant dose of the body region 102 is related to the dopant concentration of dopants of the second conductivity type, whereas the dopant dose of the barrier region 107 is related to the dopant concentration of dopants of the first conductivity type.

For example, each of the dopant doses referred to herein is defined by the dopant concentration integrated along the vertical direction Z (that points from the first load terminal 11 to the second load terminal 12).

Further, each of the dopant doses referred to herein can be defined as the dopant dose averaged along a distance of at least 1 μm or a width of a mesa portion 17 in at least one of the lateral directions X/Y perpendicular to the vertical direction Z. The respective dopant dose can even be defined by the dopant dose averaged along the total lateral extension of the respective region, or, respectively, volume, in the lateral direction X/Y. For example, for comparison purposes, the dopant dose of the barrier region 107 is determined along the same lateral and vertical distances as the dopant dose of the body region 102 in the diode section 1-22. Furthermore, when determining the dopant dose of the barrier region 107, the recesses 1071 mentioned further below are not taken into account; i.e., the integration path does not traverse the recesses 1071, but only those mesa portions where the barrier region 107 is implemented. For example, the dopant dose of the body region 102 is determined in a portion of the body region 102 by integrating the dopant concentration along a vertical path between the frontside 110 and the pn-junction 1021, wherein the optionally present very highly doped subregions (e.g., with concentrations above 1*10$^{18}$ cm$^{-3}$ typically arranged close to the frontside for establishing the electrical contact to the contact plugs 111) are not taken into account; i.e., the integration path does not include such optional highly doped contact subportions of the body region 102.

Further, the term "dopant dose" refers to electrically active dopants of the same conductivity type. Hence, a change in dopant dose may also be achieved by keeping the dose of one dopant type constant in both portions and by applying a counter-doping and/or damage-doping. Also by such means, a difference between the (net) dopant doses can be achieved.

Furthermore, it shall be understood that the integration path according to which the dopant dose is determined does not extend beyond the boundaries of the relevant semiconductor portion.

For example, the peak dopant concentration of the barrier region 107 may amount to at least 1*10$^{15}$ cm$^{-3}$, to at least 2*10$^{16}$ cm$^{-3}$ or to even more than 5*10$^{17}$ cm$^{-3}$.

As indicated above, the average dopant concentration of the drift region 100 may be within the range of 1*10$^{12}$ cm$^{-3}$ to 1*10$^{14}$ cm$^{-3}$.

For example, the dopant dose of the barrier region 107 may amount to at least 1*10$^{12}$ cm$^{-2}$, to at least 5*10$^{12}$ cm$^{-2}$ or to even more than 2*10$^{13}$ cm$^{-2}$.

For example, the dopant dose of the body region 102 may be within the range of $1*10^{x12}$ cm$^{-2}$ to $5*10^{13}$ cm$^{-2}$ or within the range of $5*10^{12}$ cm$^{-2}$ to $3*10^{13}$ cm$^{-2}$. Here, it shall be pointed out the body region 102 may be equally configured in both the diode section 1-22 and the (optional) IGBT section 1-21. For example, the body region 102 is not laterally structured with respect to the diode section 1-22 and the IGBT section 1-21. Hence, the above indicated dopant dose of the body region 102 may be equally present in the diode section 1-22 and in the IGBT section 1-21.

In the areas where the barrier region 107 is implemented (again not taking into account the recesses 1071), the dopant dose of the barrier region 107 may be laterally homogenous. That means, the barrier region 107 can be locally provided without a VLD configuration. Nonetheless, as will be explained further below, due to the lateral structure of the barrier region 107, e.g., by means of the recesses 1071, it may be ensured that looking at the entire area of the horizontal cross-section of the diode section 1-22, the effective n-dopant dose decreases towards the peripheral portion (cf. reference numeral 1-222 in FIG. 15) of the diode section 1-22.

In addition to the comparatively high dopant dose and dopant concentration as exemplarily described above, the barrier region 107 has a lateral structure.

According to the lateral structure of the barrier region 107, at least 50% or at least 70% of the body region 102 in the diode section 1-22 is coupled to the drift region 100 at least by means of the barrier region 107. For example, at least 80% of the body region 102 in the diode section 1-22 is coupled to the drift region 100 at least by means of the barrier region 107.

Further, according to the lateral structure of the barrier region 107, at least 5% of the body region 102 in the diode section 1-22 is coupled to the drift region 100 without the barrier region 107.

Here, it is noted that the body region 102 may extend throughout the entire lateral extension of the diode section 1-22, e.g., without being laterally structured, wherein, of course, being interrupted by the trenches 14, 15, 16. Said percentage values indicated above may refer to a lower "interface area" of the body region 102 that interfaces with either the drift region 100 or with the barrier region 107.

In an embodiment, the coupling between the body region 102 and the drift region 100 (with or without the barrier region 107) is established within the mesa portions 17. Hence, in each mesa portion 17, the coupling to the body region 102 may either be formed by the drift region 100 extending into the respective mesa portion 17 or by the barrier region 107 extending into the respective mesa portion 17.

For example, referring to FIG. 7 as an example, in the diode section 1-22, the barrier region 107 extends only in selected areas of the mesa portions 17. For example, in some mesa portions 17 of the diode section 1-22, the barrier region 107 is not or, respectively, only partially (with respect to the total lateral extension along the second lateral direction Y of the respective mesa portion 17) provided. If provided within a mesa portion 17, the barrier region 107 extends along the entire width (along the first lateral direction X) of that mesa portion 17.

According to the lateral structure of the barrier region 107, in an embodiment, the barrier region 107 forms a lateral overlap with at least 70%, e.g., with at least 70% to 95% of the area of the horizontal cross-section of the diode section 1-22. For example, the body region 102 in the diode section 1-22 is coupled to the drift region 100 at least by means of the barrier region 107 where said lateral overlap is established. At the remaining 5% to 30% of the area of the horizontal cross-section of the diode section 1-22, where no overlap is established, recesses 1071 filled with portions of the drift region 100 form the pn-junction with the body region 102.

Accordingly, in an embodiment, the recesses 1071 of the barrier region 107 (that means: subregions, where the comparatively highly doped barrier region 107 is not provided) laterally overlap with said at least 5% of the body region 102 in the diode section 1-22 that is coupled to the drift region 100 without the barrier region 107.

As has been explained above, the lateral distance between two adjacent trenches is defined by the (lateral) trench pitch of a pattern of the trenches 16 in the diode section 1-22.

According to the lateral structure of the barrier region 107, in an embodiment, a lateral distance between two adjacent recesses 1071 of the barrier region 107 is defined by a barrier pitch of a pattern of the barrier region 107. Said pattern may define the lateral structure of the barrier region 107. For example, a minimum of the barrier pitch is larger than a minimum of the trench pitch. For example, referring to FIG. 7 as an example, the minimum of the trench pitch is about twice as large as the minimum of the barrier pitch. In simple words, the barrier region 107 may exhibit a coarser lateral structure as compared to the structure of the trench pattern.

At the same time, the minimum of the barrier pitch can be smaller than 50% of the thickness d of the semiconductor body 10, or even smaller than 25% of thickness d, or even smaller than 10% of thickness d (i.e., smaller than 0.1*d). For example, with respect to FIG. 7, the barrier pitch may amount to approximately the sum of width of one trench 16 and the width of one mesa portion 17.

Furthermore, in terms of processing the barrier region 107 with the lateral structure, e.g., by means of implantation, it is possible that the lateral extension direction of the barrier region 107 is arranged orthogonally to the lateral extension of the trench pattern. In another embodiment, the lateral extension direction of the barrier region 107 is arranged in parallel to the lateral extension of the trench pattern. For example, the latter case is illustrated in FIG. 7. The orthogonal arrangement is exemplarily illustrated in FIG. 10; there, the lateral structure of the barrier region 107 is achieved by one or more recesses 1071 provided along the lateral extension of the mesa portion 17 in the second lateral direction Y. Of course, a lateral structure of the barrier region 107 where combinations of the parallel and the orthogonal arrangements are combined is also possible.

As indicated above and as also illustrated in FIG. 7, the power semiconductor device 1 may comprise, in that active region 1-2 and in addition to the diode section 1-22, the IGBT section(s) 1-21. For example, in this case, the power semiconductor device is an RC IGBT. According to the lateral structure of the barrier region 107, in an embodiment, at least 90% of the body region 102 in the IGBT section 1-21 is coupled to the drift region 100 without the barrier region 107. Hence, in an example, the barrier region 107 does substantially not extend into the IGBT section 1-21. For example, the barrier region 107 does not extend at all into the IGBT section 1-21. In another embodiment, a small subportion of the body regions 102 in the IGBT section 1-21 is also coupled to the drift region 100 by means of the barrier region 107.

A total vertical extension of the barrier region 107 may be within the range of 30% to 80% of the trench depth. For example, the barrier region 107 does not extend along the vertical direction Z beyond the level of the trench bottoms, but is exclusively formed in the mesa portions 17.

In an embodiment, the barrier region 107 is a laterally structured barrier layer formed within the entire area of the horizontal cross-section of the diode section 1-22. The barrier layer is interrupted by the trenches of the diode section 1-22 and by the one or more recesses 1071 that ensure that at least 50% of the body region 102 in the diode section 1-22 is coupled to the drift region 100 by means of the barrier region 107 and that at least 5% of the body region 102 in the diode section 1-22 is directly coupled to the drift region 100, i.e., without the barrier region 107. The lateral structure of the barrier layer (and the recesses 1071) can be achieved, e.g., by a mask used during an implantation processing step.

Some examples of the lateral structure of the barrier region 107 will now be described with respect to the drawings:

For example, in accordance with the embodiment illustrated in FIG. 7, the barrier region 107 extends only in about 50% of the mesa portions 17. In the remaining other 50% of the mesa portions 17, recesses 1071 of the barrier region 107 ensure that the pn-junction is formed between body region 102 and the drift region 100.

Figure 8:
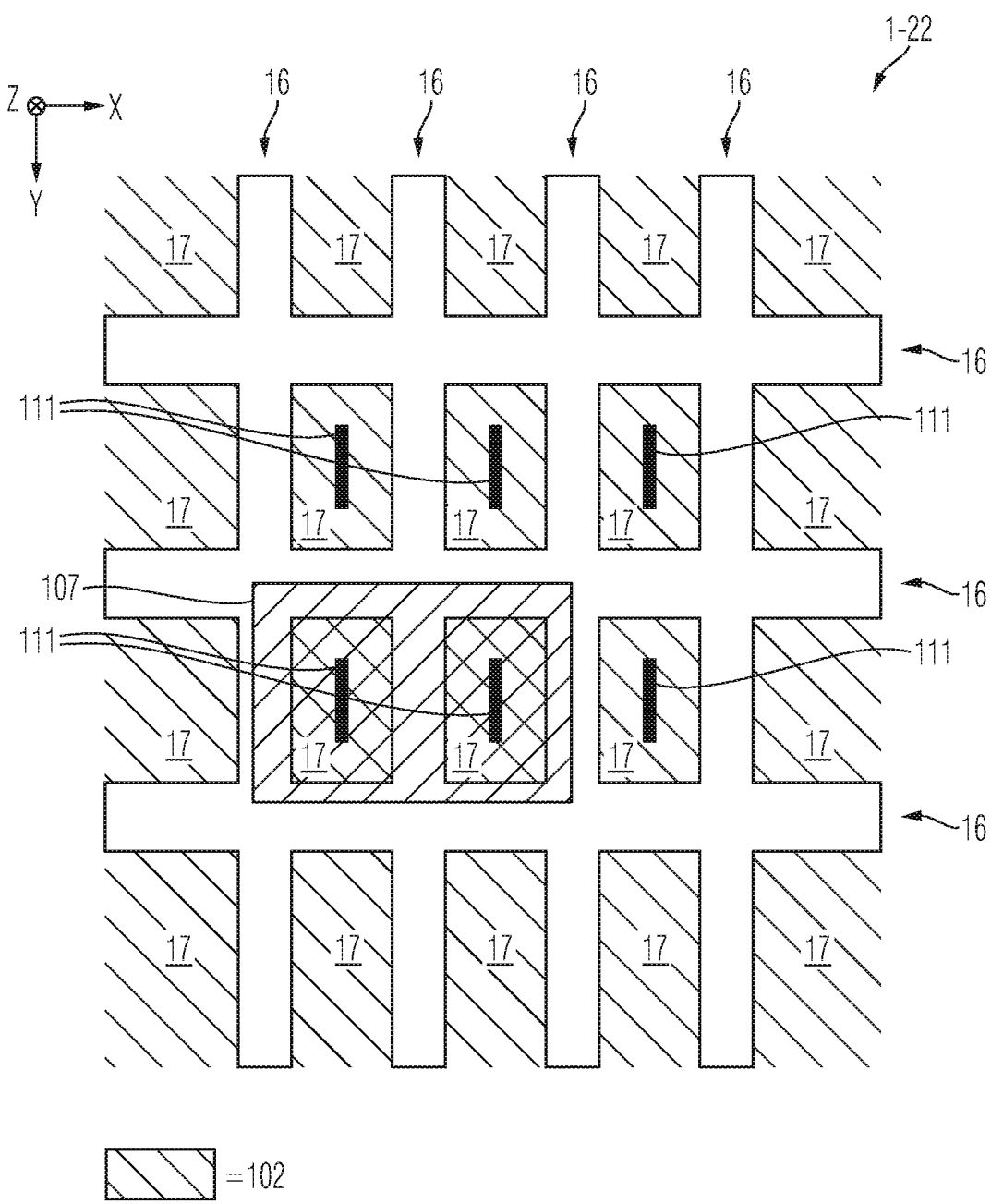
FIGS. 8-9 both schematically and exemplarily illustrate a respective section of a horizontal projection of a power semiconductor device in accordance with some embodiments.

For example, in accordance with the embodiment illustrated in FIG. 8, the lateral structure of the barrier region 107 is adapted to the contact plug structure, e.g., in a way that the barrier region 107 laterally overlaps with mesa portions 17 of the diode section 1-22 that are electrically connected to the first load terminal 11 by means of the contact plugs 111 of the contact plug structure.

Another optional aspect that is illustrated in FIG. 8 is that the trench pattern in the diode section 1-22 may also be configured so as to form a trench grid by a plurality of stripe like trenches 16 (source trenches) extending along the second lateral direction Y (as it is also the case in FIG. 7) and, additionally, by a plurality of stripe like trenches 16 (source trenches) extending along the first lateral direction X. Then, the mesa portions 17 are defined by the meshes of the trench grid.

A yet further optional aspect that is illustrated in FIG. 8 is that not every mesa portion 17 of the diode section 1-22 needs necessarily be electrically connected to the first load terminal by means of the contact plug structure. For example, the mesa portions 17 of the diode section form a mesa interface area at the frontside 110, wherein no more than 90% of the mesa interface area is contacted by the contact plug structure. For example, in the example of FIG. 8, there are 20 mesa portions 17, but only six of these 20 mesa portions are electrically connected to the first load terminal by a respective contact plug 117. The other 14 mesa portions 17 (in the exemplarily case those that surround the contacted 6 mesa portions) are not electrically connected to the first load terminal 11; hence, these mesa portions can be considered as inactive mesa portions, because no diode load current can "traverse" these mesa portions along the vertical direction Z.

Here, it shall be noted that instead of the contact plugs 111 that extend into the mesa portions 18 (e.g., into a respective contact groove 1110, cf. FIG. 10, FIG. 11), the electrical contact between first load terminal 11 and the mesa portions 17 can additionally or alternatively be established by flat contacts implemented at the frontside 110.

Figure 9:
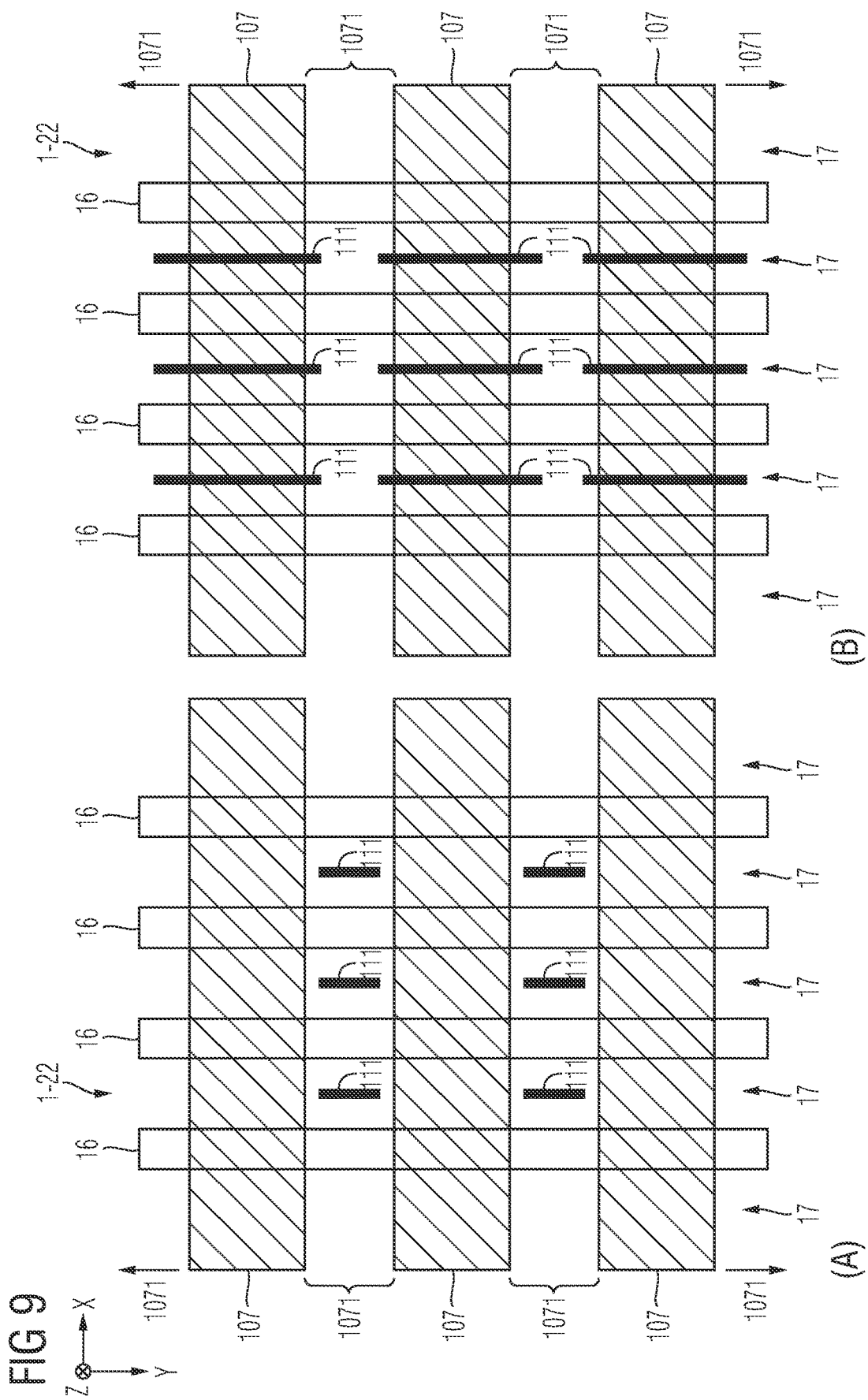

For example, in accordance with the embodiment illustrated in FIG. 9, the lateral structure of the barrier region 107 is also adapted to the contact plug structure, e.g., in a way that the barrier region 107 laterally overlaps with the contact plugs 111 of the contact plug structure (variant B) or do not laterally overlap with the contact plugs 111 (variant A). In accordance with both variants (A) and (B), the lateral structure of the barrier region 107 is defined by stripe-shaped barrier subregions and recess stripe sections extending perpendicular to the longitudinal extension of the trenches 16.

Figure 10:
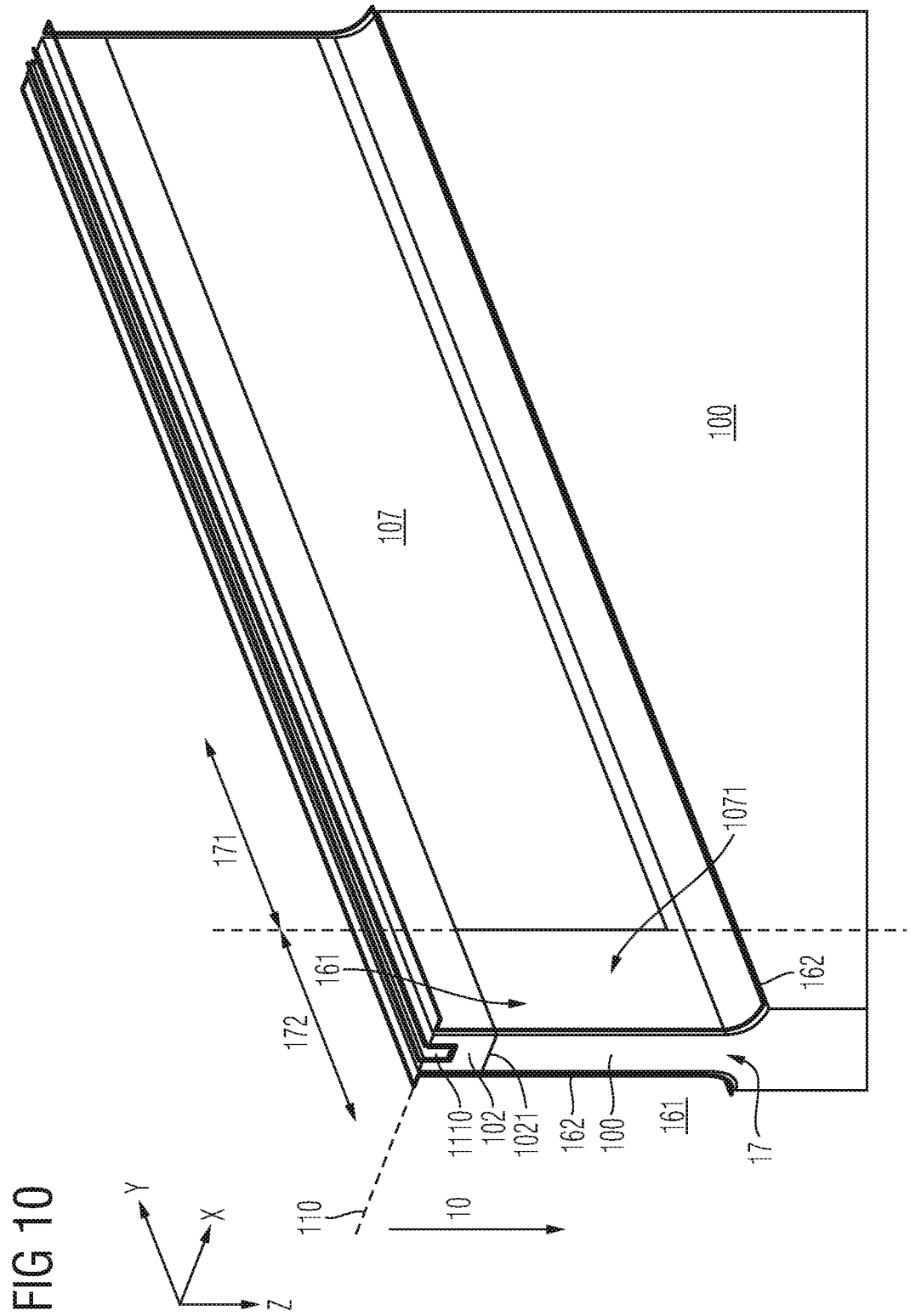
FIG. 10 schematically and exemplarily illustrates a section of a perspective projection of a power semiconductor device in accordance with some embodiments.

Additionally referring to FIG. 10, with respect to the longitudinal extension of mesa portions 17 (along the second lateral direction Y), each mesa portion 17 may be separated in one or more first mesa portions 171 that are equipped with a portion of the barrier region 107 and in one or more second mesa portions 172 where the barrier region 107 is not implemented (i.e., into which one of the recesses 1071 extends). Hence, the examples illustrated in FIGS. 9 and 10 are illustrative for a lateral structure of the barrier region 107 that is implemented in "parallel" to the trench pattern.

As indicated above, in addition or in alternative to such "parallel" lateral structure, a lateral structure orthogonal to the trench pattern can be implemented, where, e.g., stripe-shaped barrier subregions and recess stripe sections extend in parallel to the longitudinal extension of the trenches 16. An example of such lateral structure orthogonal to the trench pattern is exemplarily illustrated in FIG. 11, where, along a path in the first lateral direction X, one or more mesa portions 17 are equipped with the barrier region 107, and one or more mesa portions 17 are not equipped with the barrier region 107 (but with a recess 1071). For example, in accordance with variant (A), two adjacent mesa portions 17 are equipped with the barrier region 107, and the mesa portions 17 to the left (not illustrated) and the right of said two adjacent mesa portions 17 are not equipped with the barrier region 107. In accordance with variant (B), three adjacent mesa portions 17 are equipped with the barrier region 107, and the mesa portions 17 to the left (not illustrated) and the right of said three adjacent mesa portions 17 are not equipped with the barrier region 107. In accordance with variant (B), four adjacent mesa portions 17 are equipped with the barrier region 107, and the mesa portions 17 to the left (not illustrated) and the right of said four adjacent mesa portions 17 are not equipped with the barrier region 107.

With respect to FIG. 11, an effect of the barrier region 107 onto the pn-junctions formed in the mesa portions 17 that may be observed in some embodiments shall be explained. For example, due to the increased dopant concentration/dose of the barrier region 107 (as compared to the drift region), the pn-junction 1021 formed in the mesa portions 17 where the barrier region 107 is implemented is arranged closer to the frontside 110 as compared to the pn-junctions 1021 in the mesa portions 17 where the barrier region 107 is not formed. Said difference dZ (cf. variants B and C) in the vertical level may be within the range of 50 nm to 700 nm.

Figure 12:
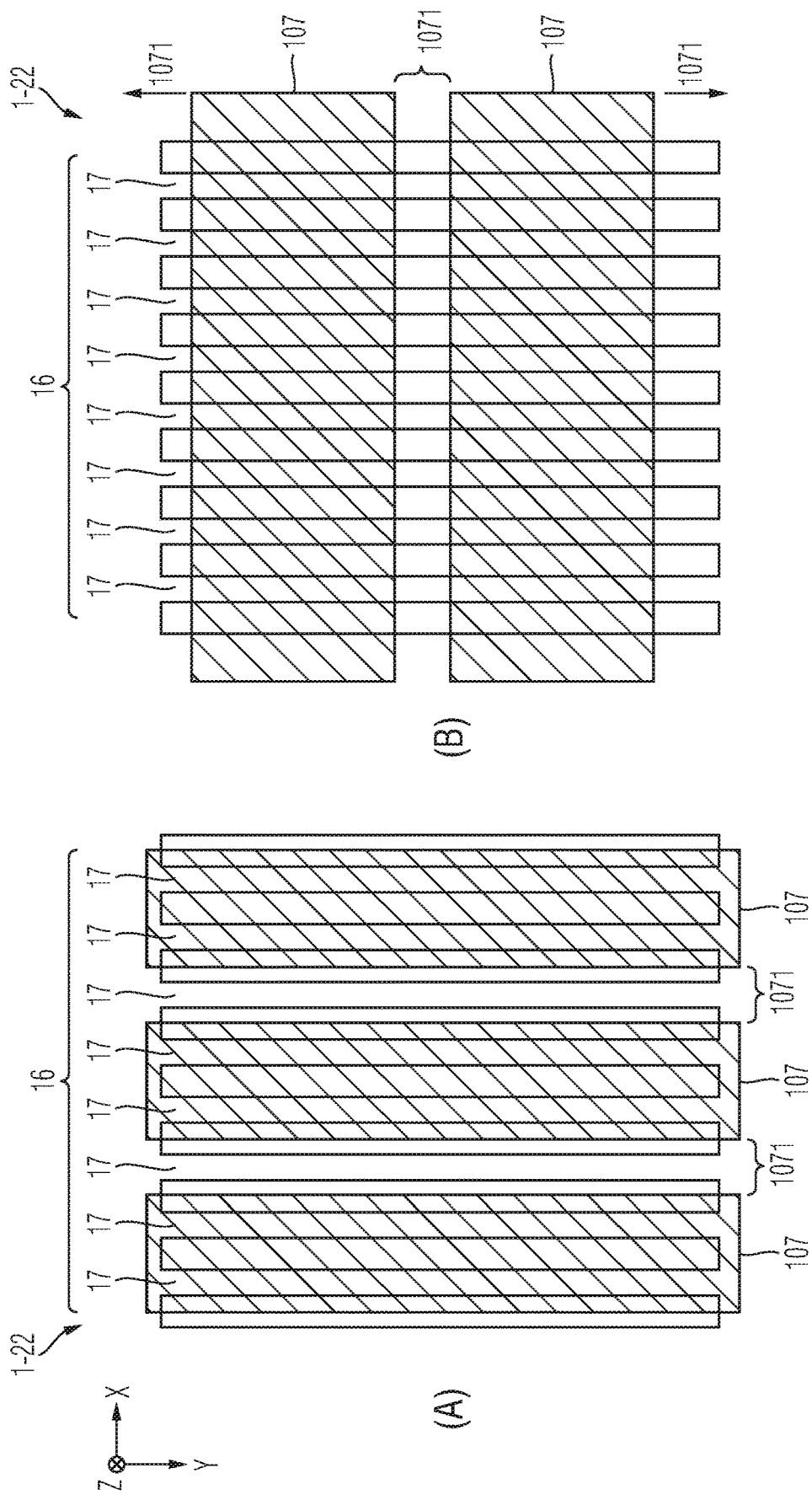
FIGS. 12-15 each schematically and exemplarily illustrate a respective section of a horizontal projection of a power semiconductor device in accordance with some embodiments.
Figure 13:
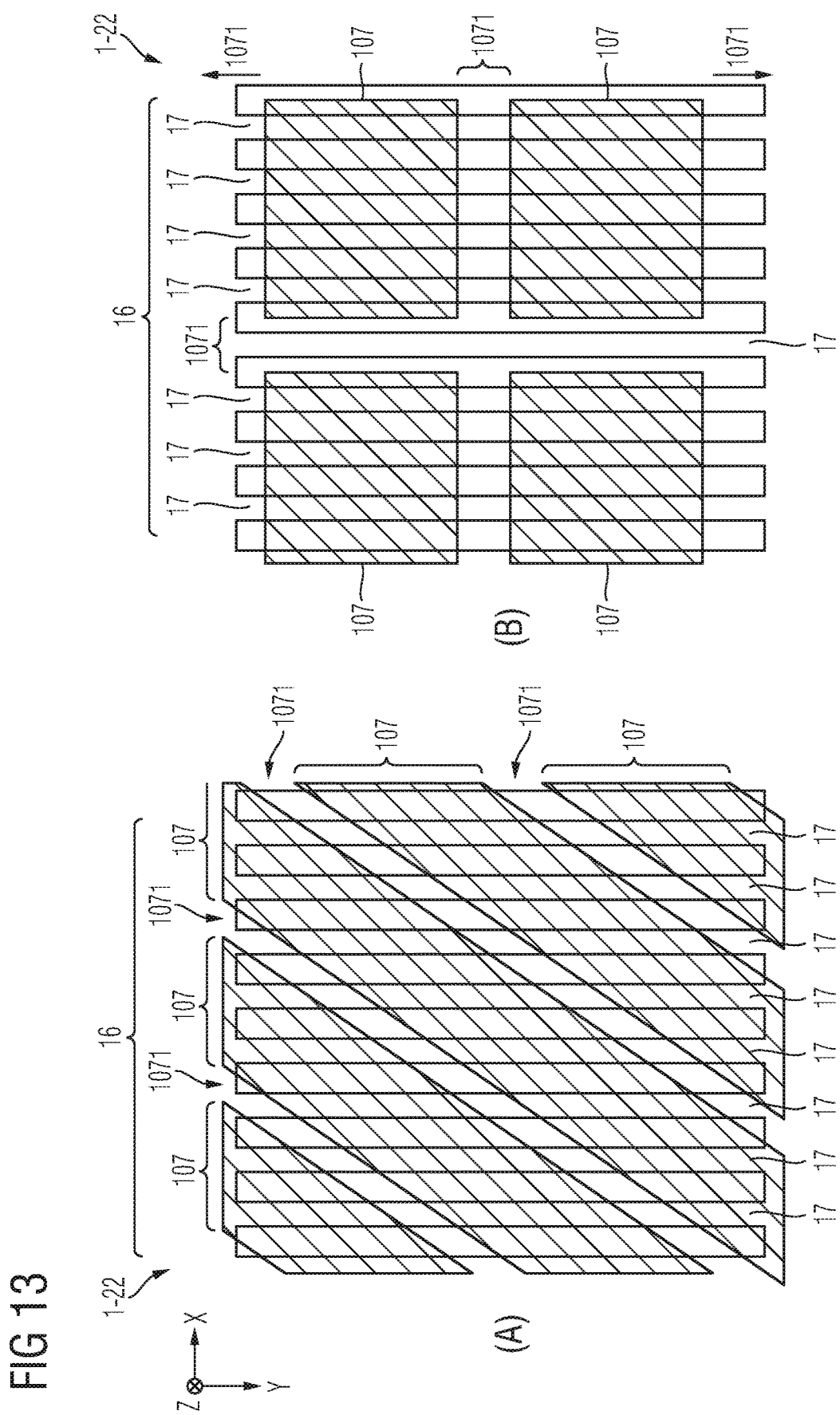
Figure 14:
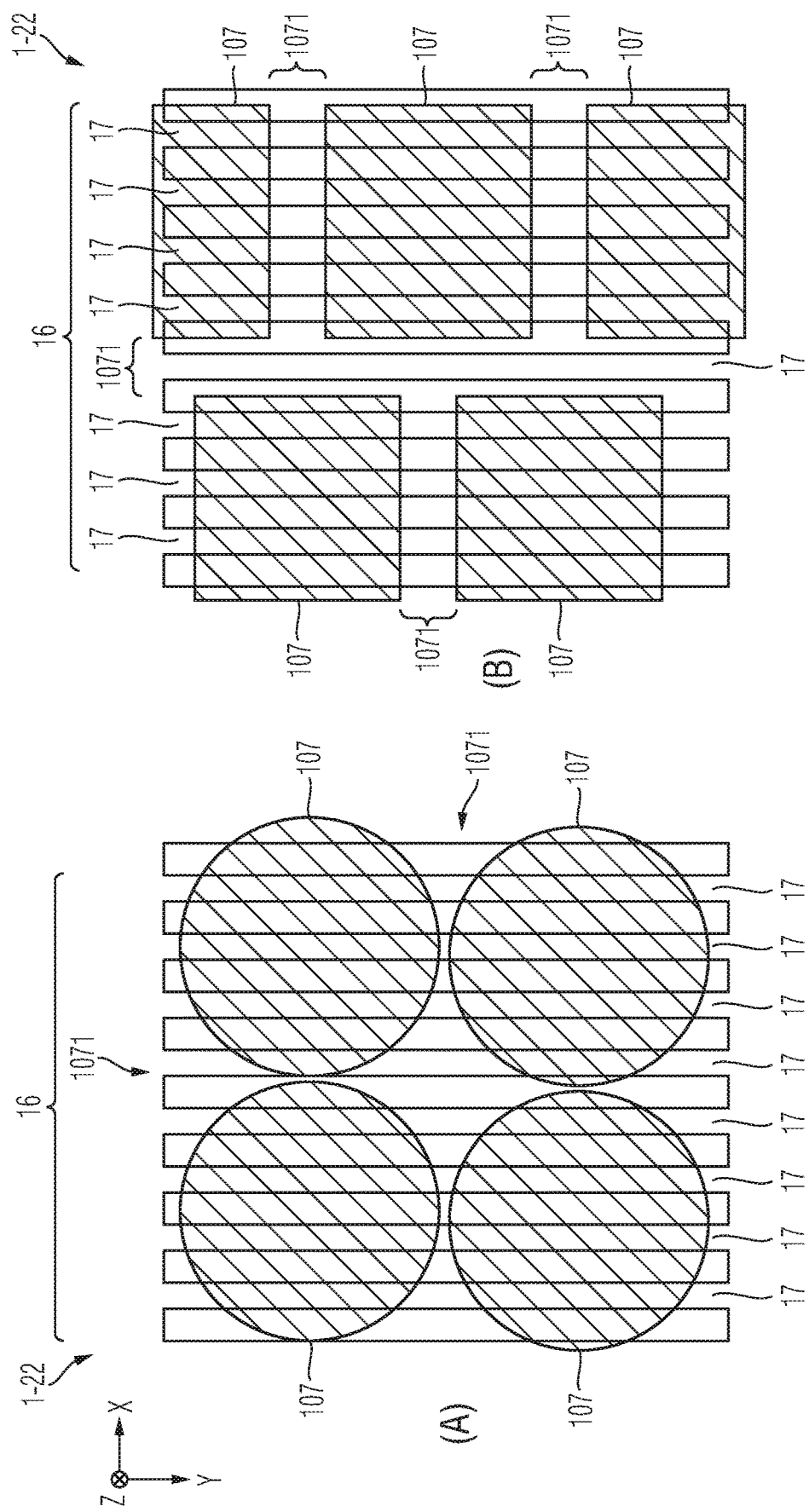

Further examples of possible lateral structures of the barrier region 107 are schematically illustrated in FIGS. 12-14.

In accordance with variant (A) of FIG. 12, the lateral structure of the barrier region 107 is defined by stripe-shaped barrier subregions and recess stripe sections extending in parallel to the longitudinal extension of the trenches 16 (yielding a lateral structure orthogonal to the trench pattern). In accordance with variant (B) of FIG. 12, the lateral structure of the barrier region 107 is defined by stripe-shaped barrier subregions and recess stripe sections extending perpendicular to the longitudinal extension of the trenches 16 (yielding a lateral structure in parallel to the trench pattern). Variant (B) of FIG. 13 shows a combination, where the structuring of the barrier region 107 occurs both orthogonally and in parallel to the trench pattern. This can be achieved, for example, by comparatively large rectangular-shaped barrier subregions separated from each other by a grid like recess structure, as also illustrated in variant (B) of FIG. 14, where the rectangular shaped barrier subregions are laterally shifted from each other.

For illustration that many possibilities of laterally structuring the barrier region 107 exist, variants (A) of FIGS. 13 and 14 show some examples; e.g., stripe-shaped barrier subregions may extend diagonally, or circle-shaped barrier subregions are formed. The illustrated exemplary lateral structures of the barrier region 107 may also be inverted, meaning that recesses 1071 are subregions of the barrier region 107 and vice versa, under the provisions that at least 50% of the body region 102 in the diode section 1-22 is coupled to the drift region 100 at least by means of the barrier region 107 and that at least 5% of the body region 102 in the diode section 1-22 is coupled to the drift region 100 without the barrier region 107.

Figure 15:
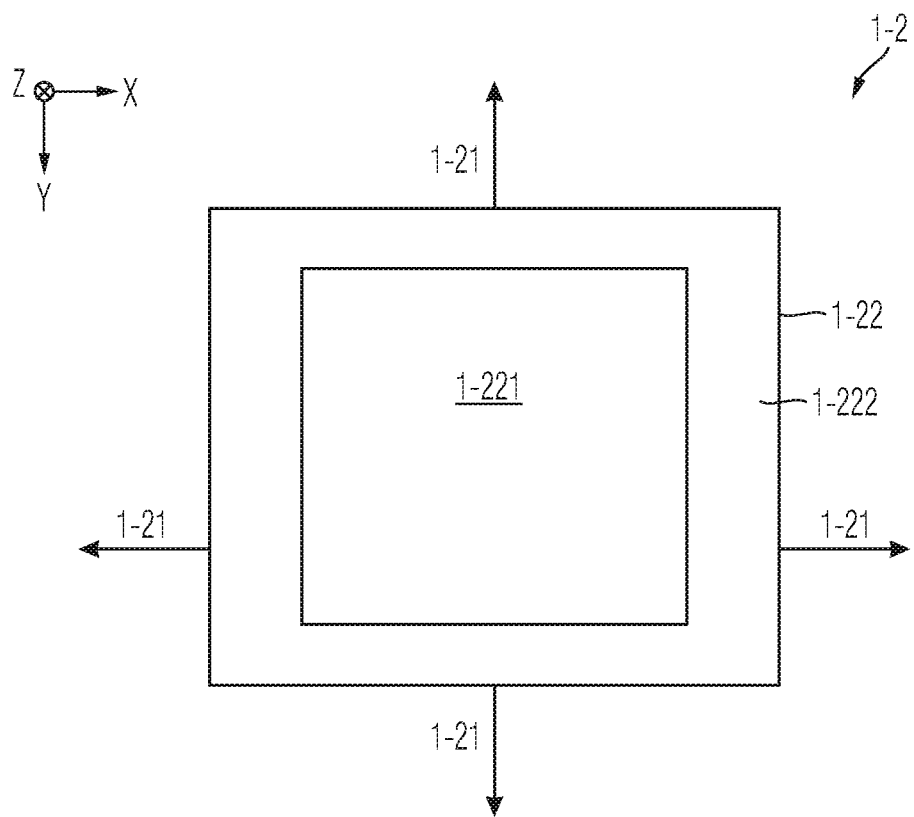

For example, in accordance with the embodiment illustrated in FIG. 15, the lateral structure of the barrier region 107 may be adapted with respect to the total lateral extension of the diode section 1-22, e.g., in that the lateral structure of the barrier region 107 in the center region 1-221 of the diode section 1-22 differs from the lateral structure of the barrier region 107 in the peripheral region 1-222 of the diode section 1-22 that, for example, interface with the IGBT section 1-21 and/or with the edge termination region 1-3. In an embodiment, said difference in the lateral structures may be such that area density of the barrier region 107 in the peripheral region 1-222 is lower as compared to the area density of the barrier region 107 in the center region 1-222; e.g., the percentage share of the body region 102 in the peripheral region 1-222 that is coupled to the drift region 100 by means of the barrier region 107 is lower than the percentage share of the body region 102 in the center region 1-221 that is coupled to the drift region 100 by means of the barrier region 107. For example, recesses 1071 in the peripheral region 1-222 may be larger and/or occur more often than recesses 1071 in the in the center region 1-221.

Additionally or alternatively, the barrier pitch in the peripheral region 1-222 may be smaller than the barrier pitch in the center region 1-221; In another embodiment, said difference in the lateral structures may be such that area density of the barrier region 107 in the peripheral region 1-222 is higher as compared to the area density of the barrier region 107 in the center region 1-222; e.g., the percentage share of the body region 102 in the peripheral region 1-222 that is coupled to the drift region 100 by means of the barrier region 107 is higher than the percentage share of the body region 102 in the center region 1-221 that is coupled to the drift region 100 by means of the barrier region 107. For example, recesses 1071 in the peripheral region 1-222 may be smaller and/or occur less often than recesses 1071 in the center region 1-221.

Additionally or alternatively, the barrier pitch in the peripheral region 1-222 may be smaller than the barrier pitch in the center region 1-221.

In yet another embodiment, the recesses 1071 in the barrier region 107 may be distributed not in a regular pattern, but inhomogeneously in distance and/or size.

Presented herein is also a method of processing a power semiconductor device. An embodiment of the method comprises forming: an active region with a diode section; an edge termination region surrounding the active region; a semiconductor body having a frontside and a backside; a first load terminal at the semiconductor body frontside and a second load terminal at the semiconductor body backside, wherein the diode section is configured for conduction of a diode load current between the first load terminal and the second load terminal; a drift region of a first conductivity type formed in the semiconductor body and extending into the diode section; a plurality of trenches arranged in the diode section, each trench extending from the frontside along the vertical direction into the semiconductor body and comprising a trench electrode isolated from the semiconductor body by a trench insulator, wherein two adjacent trenches define a respective mesa portion in the semiconductor body; a body region of a second conductivity type formed in the mesa portions of the semiconductor body and being electrically connected to the first load terminal; in the diode section, a barrier region of the first conductivity between the body region and the drift region, wherein the barrier region has a dopant concentration at least 100 times greater than the average dopant concentration of the drift region and a dopant dose greater than a dopant dose of the body region. The barrier region has a lateral structure according to which at least 50% of the body region in the diode section is coupled to the drift region at least by means of the barrier region; and at least 5% of the body region in the diode section is coupled to the drift region without the barrier region.

Exemplary embodiments of this method correspond to the embodiment of the power semiconductor device 1 described above. In one embodiment, the barrier region 107 is formed using a mask during an implantation processing step, during which, e.g., phosphorus is implanted. The mask may be structured so as to achieve the lateral structure of the barrier region 107 with the recesses, wherein examples of the lateral structure have been explained above. For example, the barrier region 107 is formed before forming the body region 102.

In the above, embodiments pertaining to power semiconductor device, such as RC IGBTs and diodes, and corresponding processing methods were explained. It is proposed to introduce the barrier region 107 in the diode section 1-22 of a diode or, respectively, of an RC IGBT. For example, the dopant dose of the barrier region 107 is sufficiently high to restrict any hole-injection into the drift region 100 (e.g., higher than $2*10^{13}$ cm$^{-2}$). By opening the barrier region 107 by means of the recesses 1071, holes may be injected into the device 1. As the electron path is not significantly inhibited by the additional barrier region 107, a part of the electron current passes through the barrier region 107. A hole current is only injected by the fraction of the electron current flowing through the recesses 1071. By structuring the barrier region 107 by means of the recesses 1071, the plasma concentration is relatively constant in a lateral cross-section, hence, the current density is not significantly lower in sections where the barrier region 107 is implemented. Furthermore, by "opening" the barrier region 107 by means of the recesses 1071 with a specific area-ratio, the effective anode efficiency of the device 1 may be precisely controlled. A potential benefit of such a lateral structure of the barrier region 107 is a flexibility in adjusting the current dependency of the emitter efficiency. For example, emitter controlled diodes usually suffer from a comparably high emitter efficiency at low current densities, which may be critical in terms of a current snap-off during reverse recovery. By introducing the laterally structured the barrier region 107, the overall anode-side plasma level at low current density can be reduced keeping the same plasma level at nominal conditions.

In the above, embodiments pertaining to power semiconductor device, such as RC IGBTs and diodes, and corresponding processing methods were explained.

For example, these power semiconductor device are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    an active region with a diode section;
    an edge termination region surrounding the active region;
    a semiconductor body having a frontside and a backside;
    a first load terminal at the semiconductor body frontside and a second load terminal at the semiconductor body backside, the diode section being configured for conduction of a diode load current between the first load terminal and the second load terminal;
    a drift region of a first conductivity type formed in the semiconductor body and extending into the diode section;
    a plurality of trenches arranged in the diode section, each trench extending from the frontside along a vertical direction into the semiconductor body and comprising a trench electrode isolated from the semiconductor body by a trench insulator, wherein two adjacent trenches define a respective mesa portion in the semiconductor body;
    a body region of a second conductivity type formed in the mesa portions of the semiconductor body and electrically connected to the first load terminal; and
    in the diode section, a barrier region of the first conductivity between the body region and the drift region,
    wherein the barrier region has a dopant concentration at least 100 times greater than an average dopant concentration of the drift region and a dopant dose greater than a dopant dose of the body region,
    wherein the barrier region has a lateral structure according to which:
        at least 50% of the body region in the diode section is coupled to the drift region at least by the barrier region; and
        at least 5% of the body region in the diode section is coupled to the drift region without the barrier region.

2. The power semiconductor device of claim 1, wherein the lateral structure of the barrier region forms a lateral overlap with at least 70% of an area of a horizontal cross-section of the diode section, and wherein the body region in the diode section is coupled to the drift region at least by the barrier region where the lateral overlap is established.

3. The power semiconductor device of claim 1, wherein the barrier region comprises recesses laterally overlapping with the at least 5% of the body region in the diode section that is coupled to the drift region without the barrier region.

4. The power semiconductor device of claim 3, wherein:
    a lateral distance between two adjacent recesses is defined by a barrier pitch of a pattern of the barrier region, the pattern defining the lateral structure of the barrier region;
    a lateral distance between two adjacent trenches is defined by a trench pitch of a pattern of the trenches in the diode section; and
    a minimum of the barrier pitch is larger than a minimum of the trench pitch.

5. The power semiconductor device of claim 4, wherein the minimum of the barrier pitch is smaller than 50% of a thickness of the semiconductor body, the thickness being the distance along the vertical direction from the frontside to the backside in the diode section.

6. The power semiconductor device of claim 4, wherein the lateral extension direction of the barrier region is arranged orthogonally to the lateral extension of the trench pattern.

7. The power semiconductor device of claim 4, wherein the lateral extension direction of the barrier region is arranged in parallel to the lateral extension of the trench pattern.

8. The power semiconductor device of claim 1, wherein at least 50% of the trench electrodes of the trenches in the diode section are electrically connected to the first load terminal.

9. The power semiconductor device of claim 1, further comprising a contact plug structure with contact plugs, wherein each contact plug is configured to establish contact with a respective mesa portion so as to electrically connect that respective mesa portion to the first load terminal.

10. The power semiconductor device of claim 9, wherein each contact plug extends from the frontside along the vertical direction into the respective mesa portion.

11. The power semiconductor device of claim 9, wherein the mesa portions form a mesa interface area at the frontside, wherein no more than 90% of the mesa interface area is contacted by the contact plug structure.

12. The power semiconductor device of claim 1, wherein the area of the horizontal cross-section of the diode section has a minimum lateral extension amounting at least to the semiconductor body thickness.

13. The power semiconductor device of claim 1, further comprising, in the active region, an IGBT section configured for conduction of a forward load current between the first load terminal and the second load terminal, wherein the diode load current is a reverse load current of the power semiconductor device, and wherein each of the plurality of trenches, the drift region, the body region also extend into the IGBT section.

14. The power semiconductor device of claim 13, wherein at least 90% of the body region in the IGBT section is coupled to the drift region without the barrier region.

15. The power semiconductor device of claim 13, wherein with respect to a volume of the active region, a ratio between a total of the IGBT section and a total of the diode section is larger than 1.5:1.

16. The power semiconductor device of claim 13, further comprising, in the IGBT section, an IGBT emitter region of the second conductivity type electrically connected to the second load terminal and coupled to the drift region.

17. The power semiconductor device of claim 13, further comprising, in the diode section, a diode cathode region of the first conductivity type electrically connected to the second load terminal and coupled to the drift region.

18. A method of processing a power semiconductor device, the method comprising:
- forming an active region with a diode section;
- forming an edge termination region surrounding the active region;
- forming a semiconductor body having a frontside and a backside;
- forming a first load terminal at the semiconductor body frontside and a second load terminal at the semiconductor body backside, wherein the diode section is configured for conduction of a diode load current between the first load terminal and the second load terminal;
- forming a drift region of a first conductivity type in the semiconductor body and extending into the diode section;
- forming a plurality of trenches arranged in the diode section, each trench extending from the frontside along a vertical direction into the semiconductor body and comprising a trench electrode isolated from the semiconductor body by a trench insulator, wherein two adjacent trenches define a respective mesa portion in the semiconductor body;
- forming a body region of a second conductivity type in the mesa portions of the semiconductor body and being electrically connected to the first load terminal; and
- forming, in the diode section, a barrier region of the first conductivity between the body region and the drift region,
wherein the barrier region has a dopant concentration at least 100 times greater than an average dopant concentration of the drift region and a dopant dose greater than a dopant dose of the body region,
wherein the barrier region has a lateral structure according to which:
- at least 50% of the body region in the diode section is coupled to the drift region at least by the barrier region; and
- at least 5% of the body region in the diode section is coupled to the drift region without the barrier region.

\* \* \* \* \*